(12) United States Patent
Loubet et al.

(10) Patent No.: US 10,903,331 B2
(45) Date of Patent: Jan. 26, 2021

(54) POSITIONING AIR-GAP SPACERS IN A TRANSISTOR FOR IMPROVED CONTROL OF PARASITIC CAPACITANCE

(71) Applicant: International Business Machines Corporation, Armonk, NY (US)

(72) Inventors: Nicolas Loubet, Guilderland, NY (US); Kangguo Cheng, Schenectady, NY (US); Wenyu Xu, Albany, NY (US); Julien Frougier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/363,355

(22) Filed: Mar. 25, 2019

(65) Prior Publication Data
US 2020/0312977 A1   Oct. 1, 2020

(51) Int. Cl.
*H01L 29/49*   (2006.01)
*H01L 29/66*   (2006.01)
*H01L 29/78*   (2006.01)

(52) U.S. Cl.
CPC ...... *H01L 29/4991* (2013.01); *H01L 29/6681* (2013.01); *H01L 29/66545* (2013.01); *H01L 29/7851* (2013.01)

(58) Field of Classification Search
CPC ....... H01L 29/41791; H01L 2029/7858; H01L 29/7855–7856; H01L 29/42356; H01L 29/4236; H01L 29/42372; H01L 29/42376; H01L 29/4238; H01L 29/42392; H01L 29/0653; H01L 29/4991; H01L 29/4983; H01L 29/515
See application file for complete search history.

(56) References Cited

U.S. PATENT DOCUMENTS

| 5,466,630 A | * | 11/1995 | Lur | H01L 21/76264 257/E21.564 |
| 6,005,285 A | * | 12/1999 | Gardner | H01L 21/02381 257/607 |
| 8,637,930 B2 | | 1/2014 | Ando et al. | |
| 9,362,355 B1 | | 6/2016 | Cheng et al. | |
| 9,443,956 B2 | | 9/2016 | Yu et al. | |

(Continued)

OTHER PUBLICATIONS

Cheng et al., "Air Spacer for 10nm FinFET CMOS and Beyond," 2016 IEEE International Electron Devices Meeting (IEDM), 17.1, IEEE, 2016, 4 pages.

(Continued)

*Primary Examiner* — Scott B Geyer
(74) *Attorney, Agent, or Firm* — Cantor Colburn LLP; Joseph Petrokaitis

(57) ABSTRACT

Embodiments of the invention are directed to a method of fabricating a field effect transistor device, wherein the fabrication operations include forming a channel region over a substrate, forming a gate region over a top surface and along sidewalls of the channel region, and forming a source or drain (S/D) region over the substrate. A bottom encapsulated air-gap is formed over the substrate, and a first portion of the bottom encapsulated air-gap is positioned between the gate region and the S/D region. The first portion of the bottom encapsulated air-gap is further positioned below the top surface of the channel region.

16 Claims, 26 Drawing Sheets

(56) References Cited

U.S. PATENT DOCUMENTS

| | | | |
|---|---|---|---|
| 9,515,156 | B2 | 12/2016 | Besser et al. |
| 9,608,065 | B1 | 3/2017 | Bergendahl et al. |
| 9,673,293 | B1 | 6/2017 | Cheng et al. |
| 9,716,158 | B1 | 7/2017 | Cheng et al. |
| 9,786,598 | B2 | 10/2017 | Kim et al. |
| 9,831,346 | B1 | 11/2017 | Zang et al. |
| 9,865,738 | B2 | 1/2018 | Kim |
| 9,905,643 | B1 | 2/2018 | Bergendahl et al. |
| 10,128,334 | B1* | 11/2018 | Bourjot ............... H01L 27/0924 |
| 10,141,431 | B1* | 11/2018 | Hung ................ H01L 21/76232 |
| 10,529,826 | B1* | 1/2020 | Frougier ........... H01L 29/41725 |
| 10,553,696 | B2* | 2/2020 | Ando ............. H01L 21/823814 |
| 10,559,656 | B2* | 2/2020 | Bourjot ............. H01L 29/41791 |
| 2003/0173617 | A1* | 9/2003 | Sato ...................... H01L 21/324 257/327 |
| 2009/0224339 | A1* | 9/2009 | Gogoi ................. H01L 29/7811 257/413 |
| 2015/0263122 | A1 | 9/2015 | Hsiao et al. |
| 2016/0043171 | A1* | 2/2016 | Jang ................... H01L 29/0653 257/330 |
| 2016/0163602 | A1* | 6/2016 | Anderson ....... H01L 21/823481 438/268 |
| 2017/0062423 | A1* | 3/2017 | Okano ............ H01L 21/823878 |
| 2017/0125284 | A1* | 5/2017 | Cheng ............... H01L 29/41791 |
| 2017/0194423 | A1* | 7/2017 | Lin ...................... H04N 5/2254 |
| 2017/0309719 | A1 | 10/2017 | Sun et al. |
| 2018/0033863 | A1* | 2/2018 | Xie ................. H01L 29/66795 |
| 2018/0061945 | A1* | 3/2018 | Bergendahl ....... H01L 29/66545 |
| 2018/0090586 | A1 | 3/2018 | Cheng et al. |
| 2018/0130899 | A1* | 5/2018 | Zhang ................. H01L 29/7851 |
| 2018/0138279 | A1* | 5/2018 | Xie ..................... H01L 29/6656 |
| 2018/0331232 | A1* | 11/2018 | Frougier .......... H01L 29/78696 |
| 2018/0342415 | A1* | 11/2018 | Fujino ................ H01L 29/0653 |
| 2019/0081166 | A1* | 3/2019 | Do ..................... H01L 29/7783 |

OTHER PUBLICATIONS

Sachid et al., "FinFET With Encased Air-Gap Spacers for High-Performance and Low-Energy Circuits," IEEE Electron Device Letters 38.1, 2017, pp. 16-19.

* cited by examiner

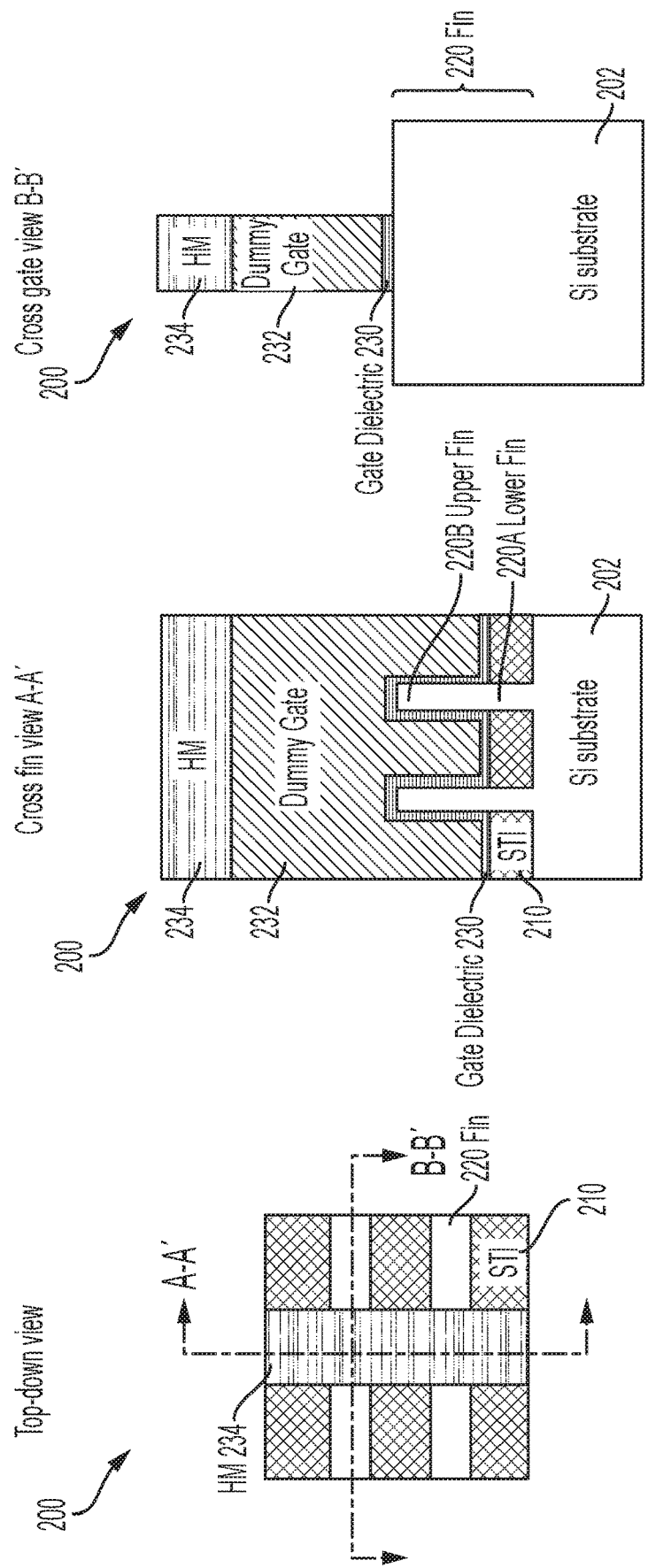

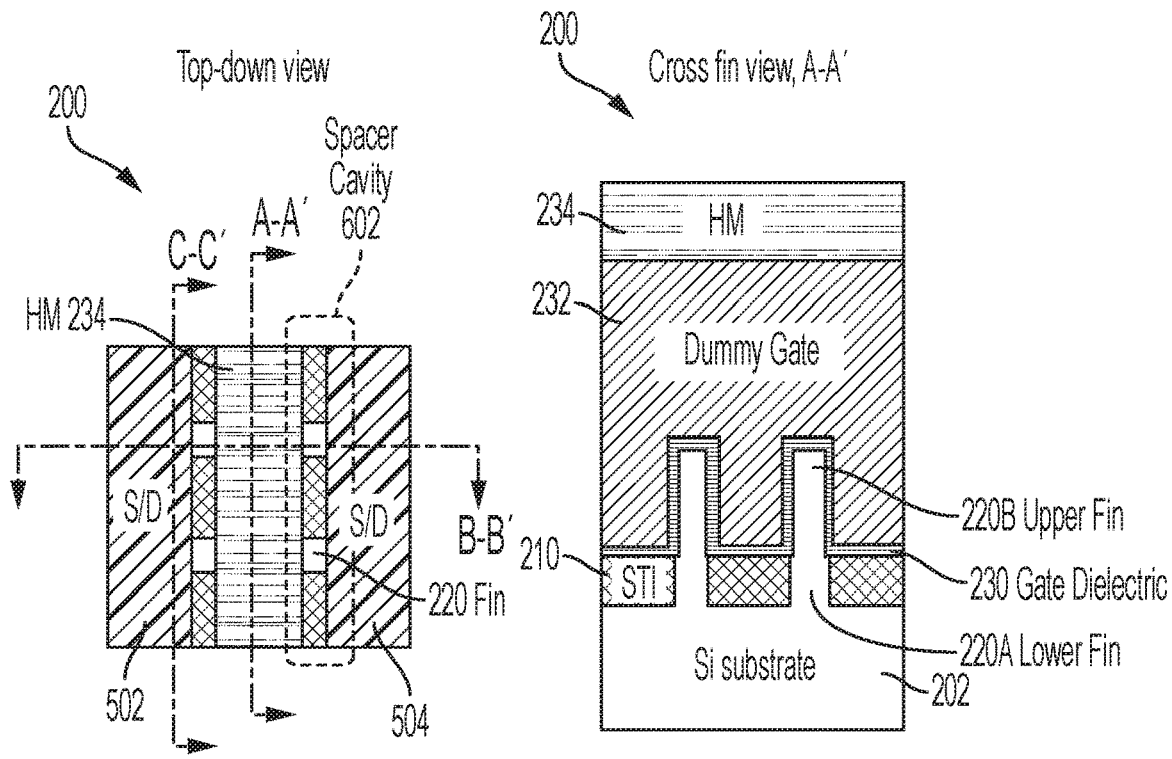
FIG. 6A
FIG. 6B
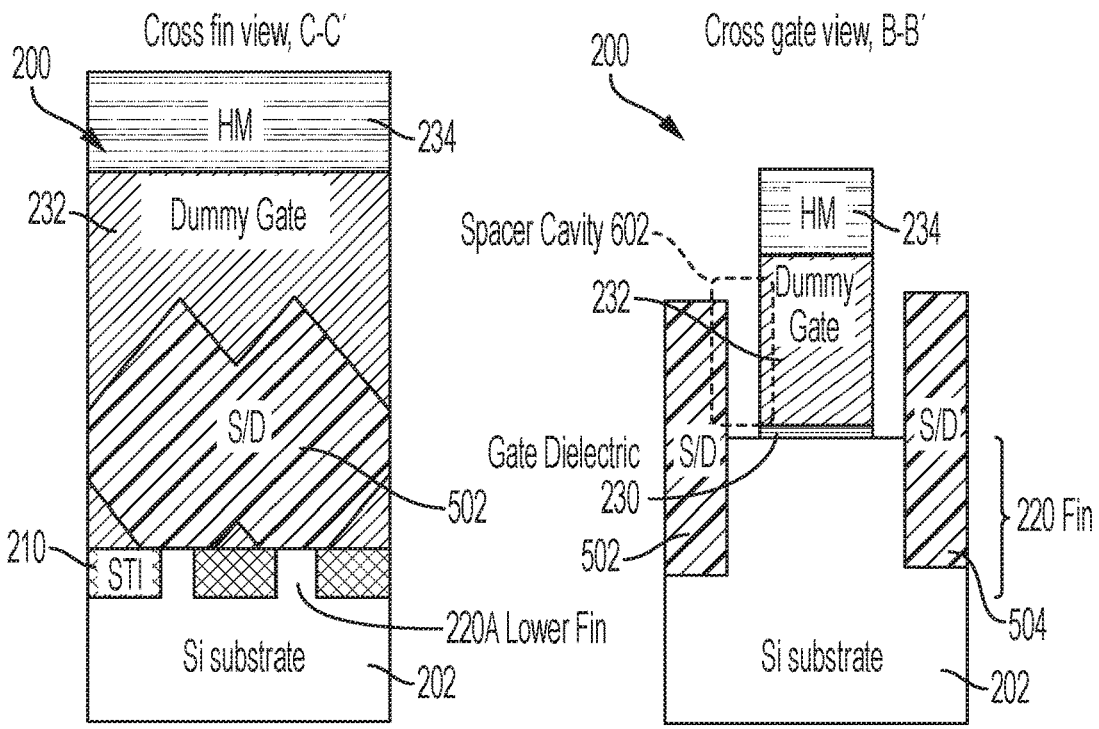
FIG. 6C
FIG. 6D

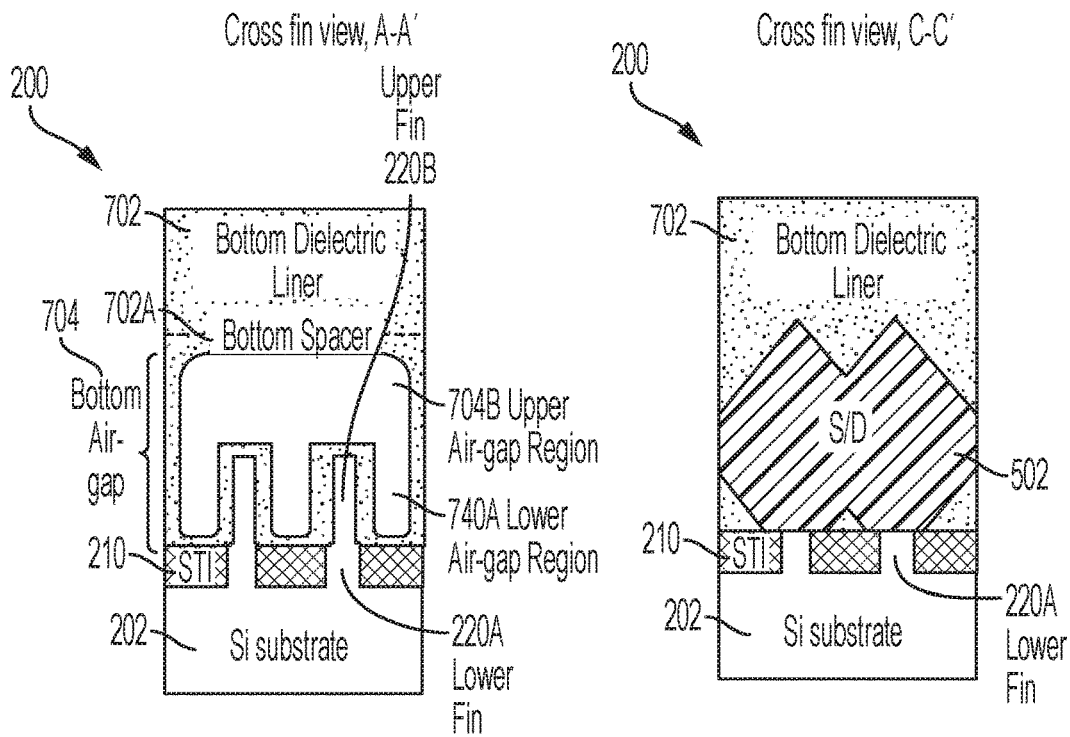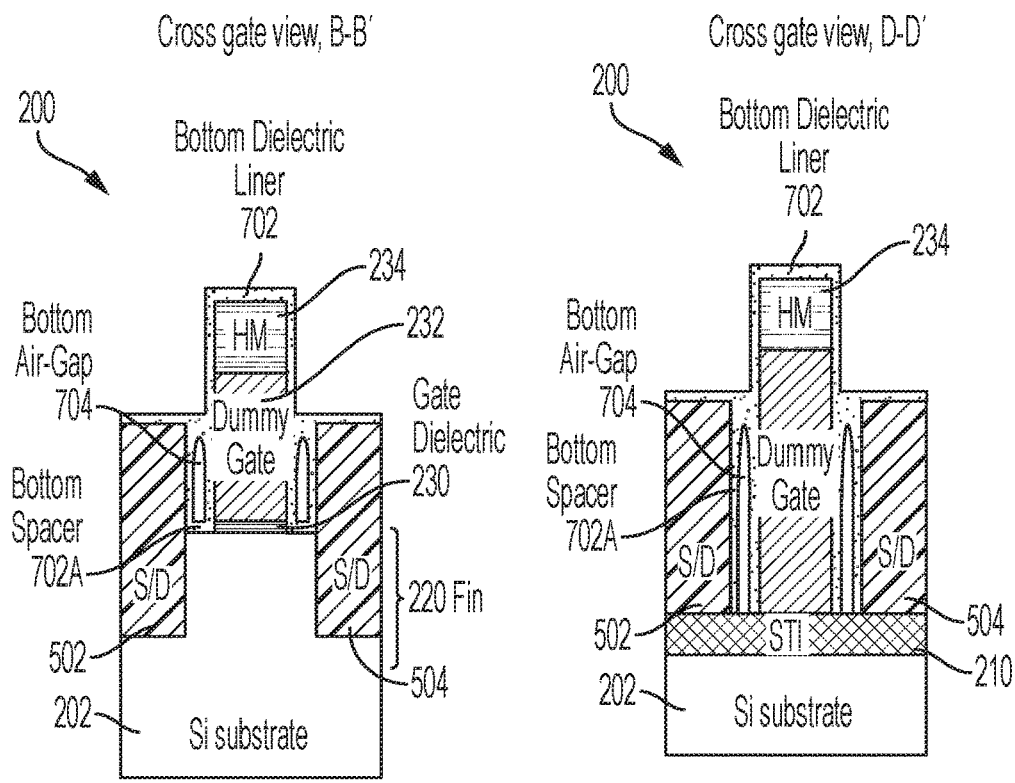

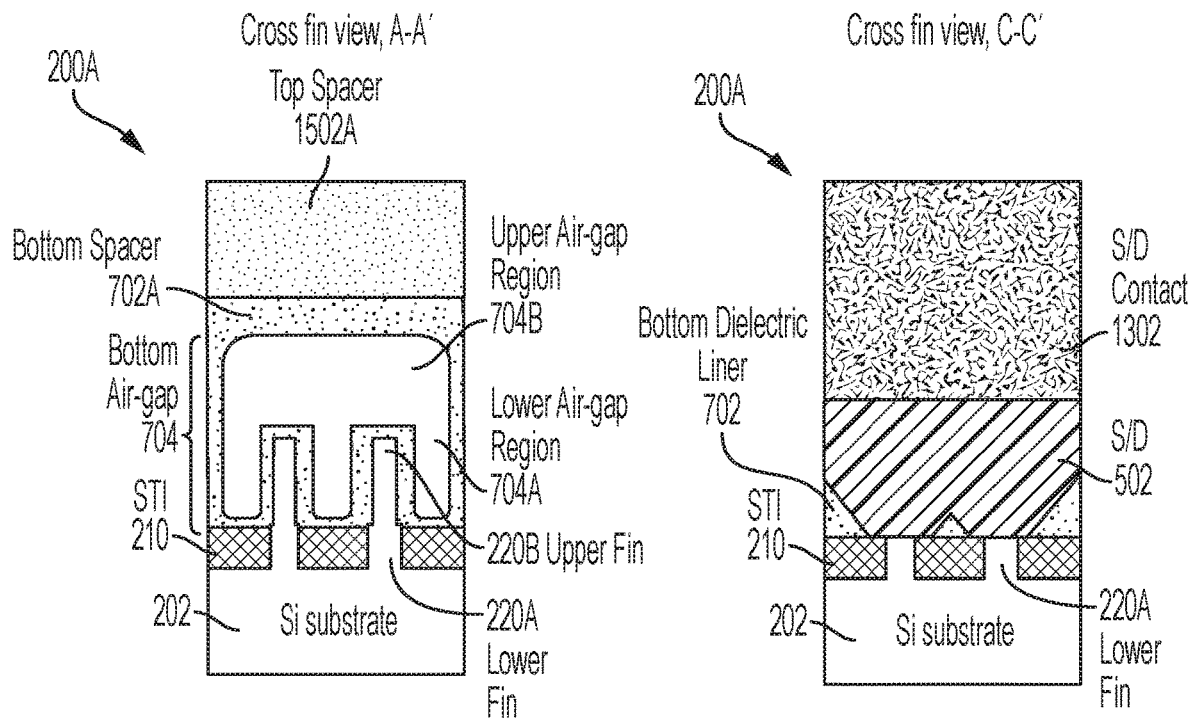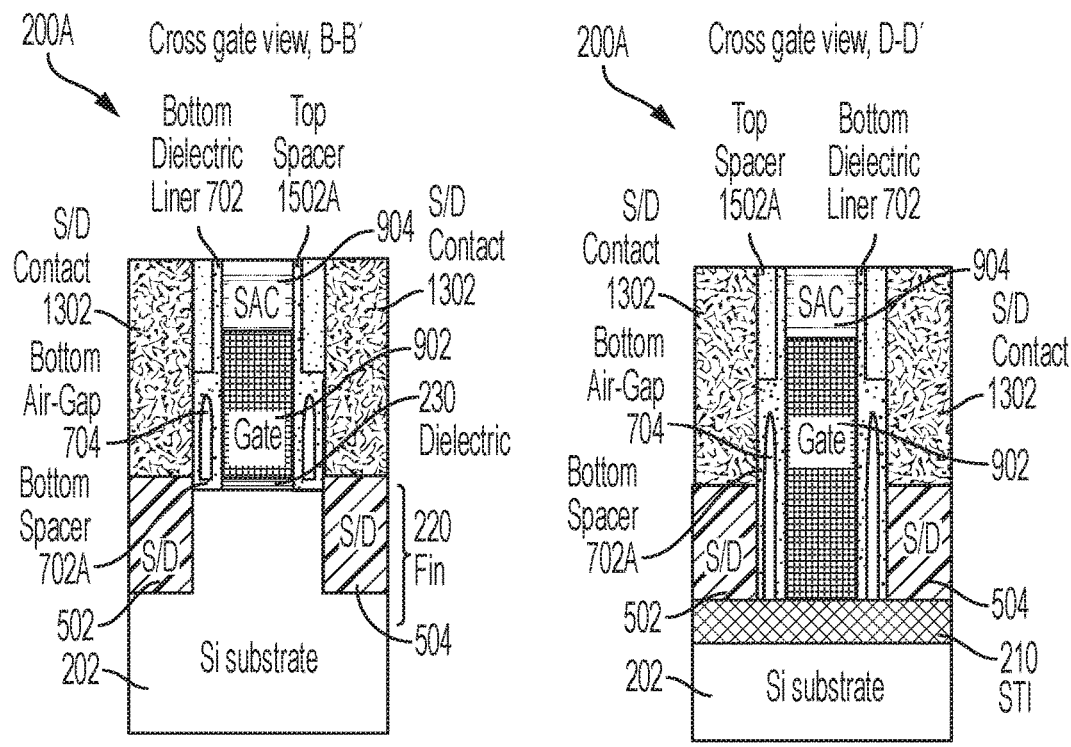
FIG. 16B
FIG. 16C
FIG. 16D
FIG. 16E

POSITIONING AIR-GAP SPACERS IN A TRANSISTOR FOR IMPROVED CONTROL OF PARASITIC CAPACITANCE

BACKGROUND

The present invention relates in general to semiconductor devices and their fabrication. More specifically, the present invention relates to improved fabrication methods and resulting structures for improving control of parasitic capacitance by positioning air-gap spacers below a top surface of a transistor's channel region and/or between the transistor's gate and source/drain (S/D) regions.

In contemporary semiconductor device fabrication processes, a large number of semiconductor devices such as n-type field effect transistors (nFETs) and p-type field effect transistors (pFETs) are fabricated on a single wafer. Non-planar transistor architectures such as fin-type FETs (Fin-FET) and nanosheet (or nanowire) transistors can provide increased device density and increased performance over planar transistors. FinFETs are non-planar, three-dimensional (3D) transistors that include a fin-shaped main body with a gate formed along the sidewalls and a top surface of the fin. The FinFET channel is the portion of the fin that is underneath the gate. Nanosheet transistors are non-planar, 3D transistors that include a gate stack wrapped around the full perimeter of multiple nanosheet channel regions for improved control of channel current flow. Non-planar FETs can include gate sidewall spacers disposed along the sidewalls of the gate structure. The gate sidewall spacers can be formed from an electrically insulating material that defines a lateral space between the gate structure and the source/drain (S/D) regions of the FET device.

SUMMARY

Embodiments of the invention are directed to a method of fabricating FET device, wherein the fabrication operations include forming a channel region over a substrate, forming a gate region over a top surface and along sidewalls of the channel region, and forming a source or drain (S/D) region over the substrate. A bottom encapsulated air-gap is formed over the substrate, and a first portion of the bottom encapsulated air-gap is positioned between the gate region and the S/D region. The first portion of the bottom encapsulated air-gap is further positioned below the top surface of the channel region.

Embodiments of the invention are further directed to a FET device. A non-limiting example of the FET includes a channel region formed over a substrate, a gate region formed over a top surface and along sidewalls of the channel region, a source or drain (S/D) region formed over the substrate, and a bottom encapsulated air-gap formed over the substrate. A first portion of the bottom encapsulated air-gap is positioned between the gate region and the S/D region, and the first portion of the bottom encapsulated air-gap is further positioned below the top surface of the channel region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments of the invention is particularly pointed out and distinctly claimed in the claims at the conclusion of the specification. The foregoing and other features and advantages of the embodiments are apparent from the following detailed description taken in conjunction with the accompanying drawings in which:

FIGS. 2A-15E depict the results of fabrication operations for forming a semiconductor device having air-gap spacers configured and positioned in accordance with embodiments of the invention, in which;

FIG. 2A depicts a top-down view of a semiconductor structure after an initial set of fabrication operations in accordance with embodiments of the invention;

FIG. 2B depicts a cross-sectional view of the semiconductor structure shown in FIG. 2A taken along line A-A';

FIG. 2C depicts a cross-sectional view of the semiconductor structure shown in FIG. 2A taken along line B-B';

FIG. 6A depicts a top-down view of the semiconductor structure after fabrication operations in accordance with embodiments of the invention;

FIG. 6B depicts a cross-sectional view of the semiconductor structure shown in FIG. 6A taken along line A-A';

FIG. 6C depicts a cross-sectional view of the semiconductor structure shown in FIG. 6A taken along line C-C';

FIG. 6D depicts a cross-sectional view of the semiconductor structure shown in FIG. 6A taken along line B-B';

FIG. 7B depicts a cross-sectional view of the semiconductor structure shown in FIG. 7A taken along line A-A';

FIG. 7C depicts a cross-sectional view of the semiconductor structure shown in FIG. 7A taken along line C-C';

FIG. 7D depicts a cross-sectional view of the semiconductor structure shown in FIG. 7A taken along line B-B';

FIG. 7E depicts a cross-sectional view of the semiconductor structure shown in FIG. 7A taken along line D-D';

FIG. 15E depicts a cross-sectional view of the semiconductor structure shown in FIG. 15A taken along line D-D';

FIG. 16B depicts a cross-sectional view of the semiconductor structure shown in FIG. 16A taken along line A-A';

FIG. 16C depicts a cross-sectional view of the semiconductor structure shown in FIG. 16A taken along line C-C';

FIG. 16D depicts a cross-sectional view of the semiconductor structure shown in FIG. 16A taken along line B-B';

FIG. 16E depicts a cross-sectional view of the semiconductor structure shown in FIG. 16A taken along line D-D';

DETAILED DESCRIPTION

Although this detailed description includes examples of how aspects of the invention can be implemented to form air-gap spacers in a FinFET device architecture formed using various combinations of materials, implementation of the teachings recited herein are not limited to a particular type of FET structure or combination of materials. Rather, embodiments of the present invention are capable of being implemented in conjunction with any other type of transistor device (e.g., nanosheet FETs, vertical FETs, and the like) or material, now known or later developed, wherein spacers are utilized to separate, for example, the gate from the S/D contacts and/or the S/D regions.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain, and electrical current flows through the channel region from the source to the drain. The electrical current flow is induced in the channel region by a voltage applied at the gate electrode. Complementary metal oxide semiconductor (CMOS) is a technology that uses complementary and symmetrical pairs of p-type and n-type MOSFETs to implement logic functions.

Figure 1:
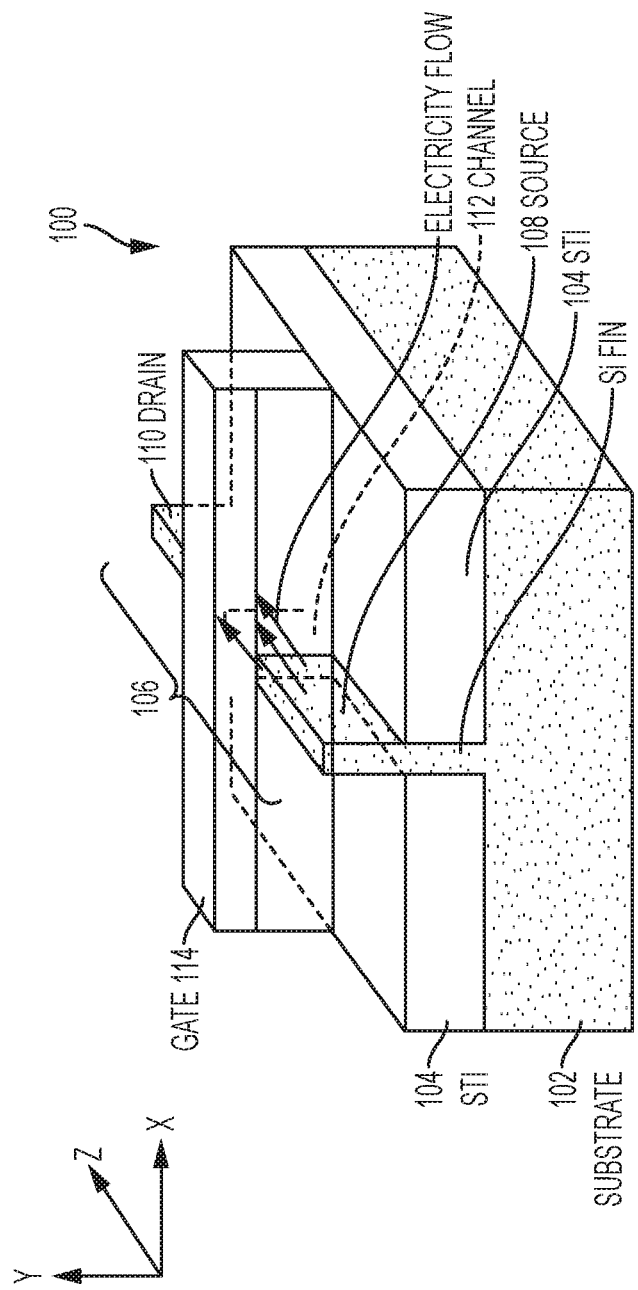
FIG. 1 depicts a three-dimensional view of an example architecture of a FinFET device capable of implementing embodiments of the invention.

A transistor type that has emerged within the MOSFET family of transistors, and which shows promise for scaling to ultra-high density and nanometer-scale channel lengths, is a so-called fin-type FET (FinFET) device. FinFETs are non-planar, three-dimensional (3D) devices that include a fin-shaped channel with a gate formed along the sidewalls and top surface of the fin channel. FIG. 1 as a three-dimensional view of a FinFET 100. The basic electrical layout and mode of operation of the FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of the channel region 112. For ease of illustration, a single fin is shown in FIG. 1. In practice, FinFET devices can be fabricated having multiple fins formed on the STI 104 and the substrate 102. The substrate 102 can be silicon, the STI 104 can be an oxide (e.g., silicon oxide), and the fin 106 can be silicon that has been enriched to a desired concentration level of germanium. Gate 114 controls the source to drain current flow (labeled ELECTRICITY FLOW in FIG. 1).

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

One challenge in fabricating multi-gate FETs, particularly with increased device density requirements, is the inherently high parasitic capacitance of non-planar FET architectures in comparison to conventional planar FET architectures. For example, nonplanar FET devices such as FinFETs can include gate sidewall spacers disposed along the sidewalls of the gate structure. The gate spacers are conventionally formed from an electrically insulating material that is configured to define a lateral space between the gate structure and the source/drain (S/D) regions of the FinFET device. As the size of integrated chip components continues to shrink, the parasitic capacitance through such gate spacers has become an increasing contributor to the total parasitic capacitance of a FinFET device. For example, gate spacers disposed along sidewalls of the gate structure of a FinFET device can have a dielectric constant that increases parasitic capacitance between the gate structure and the S/D regions, as well as between the gate structure and S/D contacts. Such parasitic capacitance degrades the electrical performance of the FinFET device by inducing an RC time delay.

It has been determined that forming air gaps in the gate spacers between the gate and the S/D contacts can reduce unwanted capacitance in semiconductor devices such as non-planar FETs. In general, an air gap spacer is a dielectric spacer that includes an enclosed void. As used herein, the term "air-gap" means an encapsulated or otherwise enclosed void that is not filled with solid material. The void can be filled with a liquid and/or a gas such as air.

Turning now to an overview of aspects of the present invention, embodiments of the invention provide technical benefits and effects, including, for example, improved fabrication methods and resulting structures for transistors having air-gap spacers. In embodiments of the invention, bottom air-gap spacers having encapsulated bottom air gaps are formed and positioned between the gate and the S/D regions of the transistor fin for improved control of parasitic capacitance. In embodiments of the invention, at least a portion of the encapsulated bottom air gaps are positioned below a top surface of the transistor's channel fin for improved control of parasitic capacitance. In embodiments of the invention, a portion of the encapsulated bottom air gap spacers is positioned above the top surface of the transistor's channel fin for improved control of parasitic capacitance. In embodiments of the invention, a portion of the encapsulated bottom air gap spacer is positioned adjacent a S/D contact and adjacent the transistor's gate. In embodiments of the invention, top air-gap spacers having encapsulated top air-gaps can be positioned above the bottom air-gap spacer, adjacent a S/D contact, adjacent a SAC region of the gate, and adjacent to a portion of the gate. In embodiments of the invention, the bottom air-gap spacers are formed prior to formation of the S/D contacts, which allows more control over the bottom air-gap spacer fabrication process. More specifically, the aspect ratio (e.g., the height) of the space in which the bottom air-gap spacers will be formed is less than the aspect ratio of that space after the S/D contacts have been formed. Thus, forming the bottom air-gap spacers in a smaller area (i.e., an area having less height) allows more control over the bottom air-gap spacer fabrication process.

In embodiments of the invention, a relatively large low-dielectric region is provided by the encapsulated bottom air-gap spacer having regions that extend below and/or above the top surface of the transistor's fin. The relatively large low-dielectric region enhances electrical performance by reducing parasitic capacitance between the gate and the S/D regions. The dielectric constant of air is about unity as compared to the dielectric constant of SiN which is about 7-7.5. In embodiments of the invention, bottom and/or top air-gap spacers can include a low-k dielectric material (e.g., SiOCN) to even further reduce the dielectric constant and further enhance electrical performance by reducing parasitic capacitance between the gate and the S/D regions.

Turning now to a more detailed description of aspects of the invention, FIG. 2A depicts a top-down view of a semiconductor structure 200 after an initial set of fabrication operations in accordance with embodiments of the invention. FIG. 2B depicts a cross-sectional view of the semiconductor structure 200 shown in FIG. 2A taken along line A-A', and FIG. 2C depicts a cross-sectional view of the semiconductor structure 200 shown in FIG. 2A taken along line B-B'. As best shown in FIG. 2B, known fabrication operations have been used to form the semiconductor structure 200 having a substrate 202, shallow trench isolation (STI) regions 210, fins 220 (best shown in FIG. 2C), a gate dielectric 230, a dummy gate 232, and a hard mask (HM) 234, configured and arranged as shown. The fin 220 includes a lower fin 220A formed from the same material (e.g., Si) as the substrate 202, along with an upper fin 220B also formed from the same material (e.g., Si) as the substrate 202. The substrate 202 can be made of any suitable substrate material, such as, for example, monocrystalline Si, SiGe, SiC, III-V compound semiconductor, II-VI compound semiconductor, or semiconductor-on-insulator (SOI).

In some embodiments of the invention, the semiconductor structure 200 shown in FIGS. 2A, 2B, and 2C can be fabricated by patterning (e.g., using the HM 234) and etching the substrate 202 to form thereon high aspect ratio (taller than wide) fins 220. A dielectric material can be deposited around the lower fin regions 220A then planarized to form the STI regions 210, which prevent electrical current from leaking between adjacent semiconductor device components formed on the substrate 202. The STI regions 210 can be of any suitable dielectric material, such as, for example, an oxide such as $SiO_2$.

As best shown in FIG. 2B, known fabrication operations have been used to form a gate dielectric (e.g., $SiO_2$) 230 and a dummy gate (e.g., amorphous silicon (a-Si)) 232 over and around the upper fins 220B in regions of the fins 220 (shown in FIG. 2C) that will form the channel regions of the final FinFET devices. For example, the known fabrication operations can include conformally depositing a layer of $SiO_2$ over the upper fin 220B, and depositing a layer/region of a-Si over the $SiO_2$ layer. The a-Si is patterned and etched to form the dummy gates 232 using, for example, a dry etch, or a combination of sequential dry and wet etches.

Figure 3A:
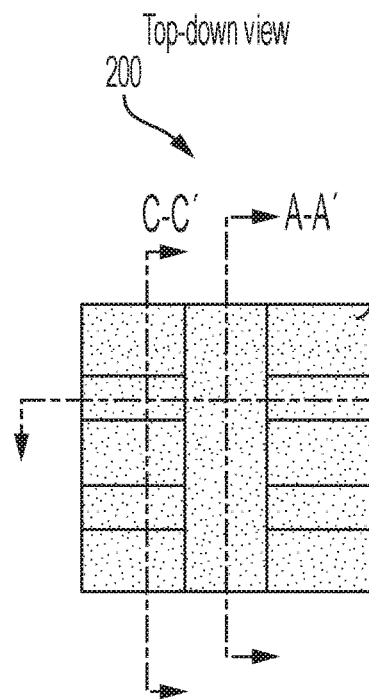
FIG. 3A depicts a top-down view of the semiconductor structure after fabrication operations in accordance with embodiments of the invention.
Figure 3B:
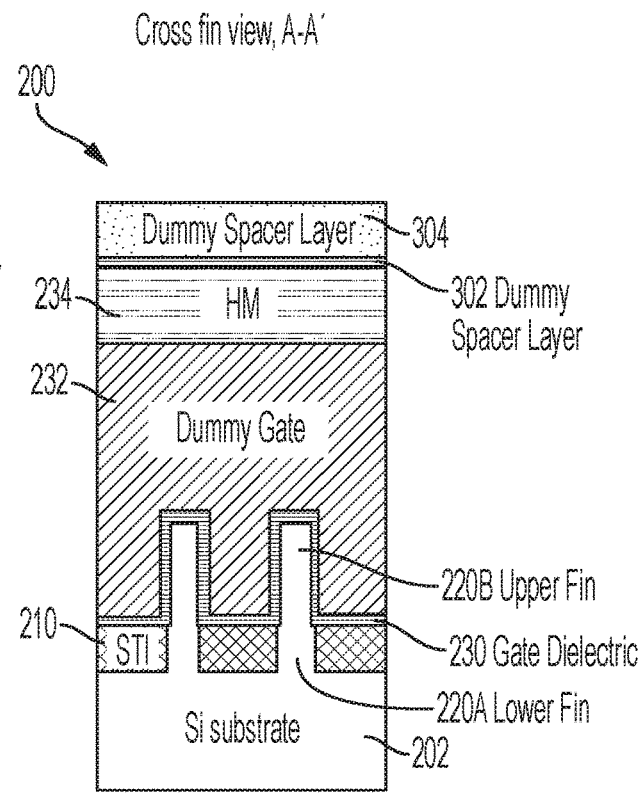
FIG. 3B depicts a cross-sectional view of the semiconductor structure shown in FIG. 3A taken along line A-A'.
Figure 3C:
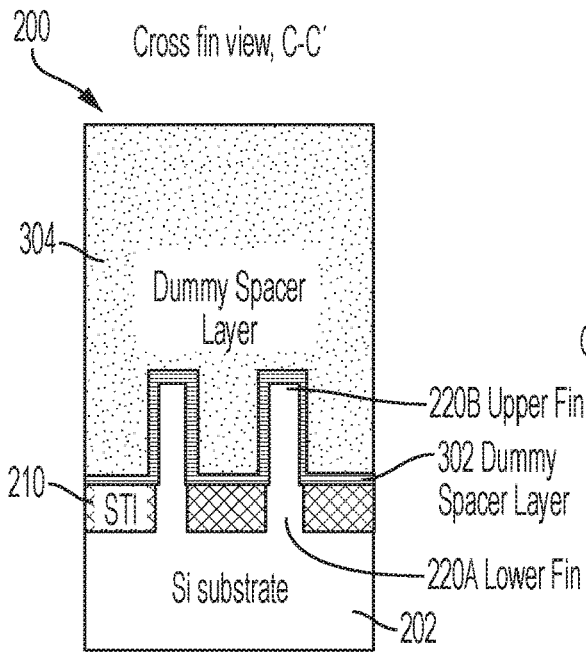
FIG. 3C depicts a cross-sectional view of the semiconductor structure shown in FIG. 3A taken along line C-C'.
Figure 3D:
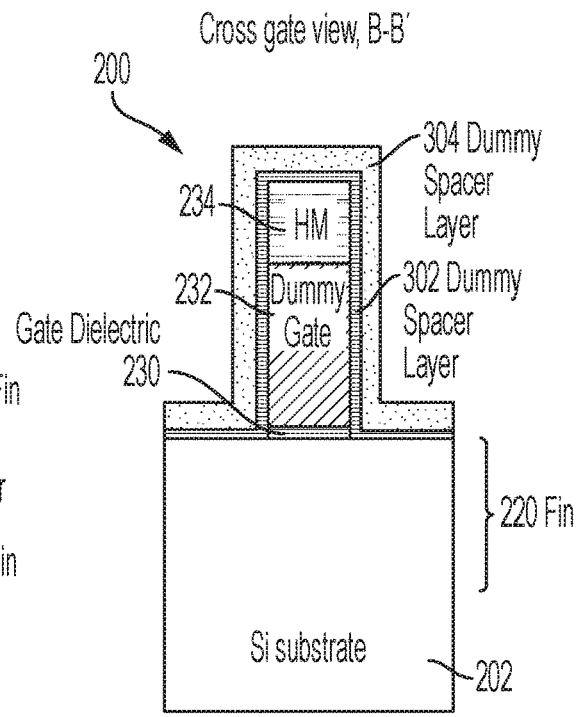
FIG. 3D depicts a cross-sectional view of the semiconductor structure shown in FIG. 3A taken along line B-B'.

FIG. 3A depicts a top-down view of the semiconductor structure 200 after additional fabrication operations in accordance with embodiments of the invention. FIG. 3B depicts a cross-sectional view of the semiconductor structure 200 shown in FIG. 3A taken along line A-A', FIG. 3C depicts a cross-sectional view of the semiconductor structure 200 shown in FIG. 3A taken along line C-C', and FIG. 3D depicts a cross-sectional view of the semiconductor structure 200 shown in FIG. 3A taken along line B-B'. As best shown in FIGS. 3B and 3D, a first layer 302 of spacer material spacer (e.g., an oxide) is conformally deposited over the structure 200, and a second layer 304 of spacer material (e.g., SiN) is conformally deposited over the first layer 302. The conformal depositions can be performed using, for example, CVD, PECVD, ALD, PVD, chemical solution deposition, or other like deposition processes.

Figure 4A:
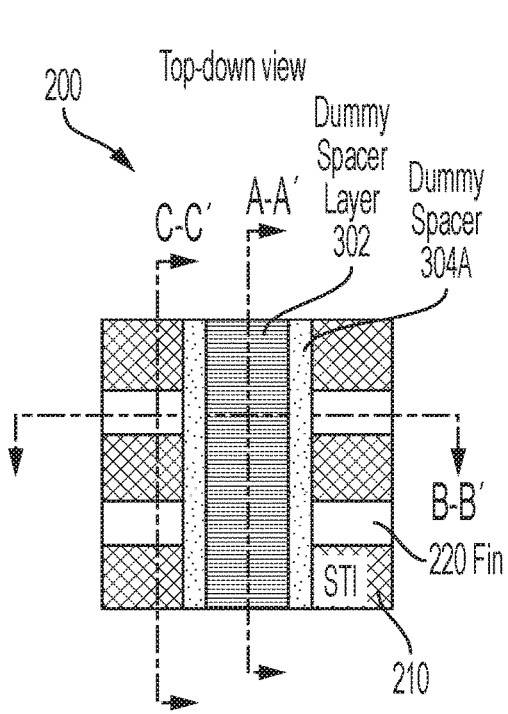
FIG. 4A depicts a top-down view of the semiconductor structure after fabrication operations in accordance with embodiments of the invention.
Figure 4B:
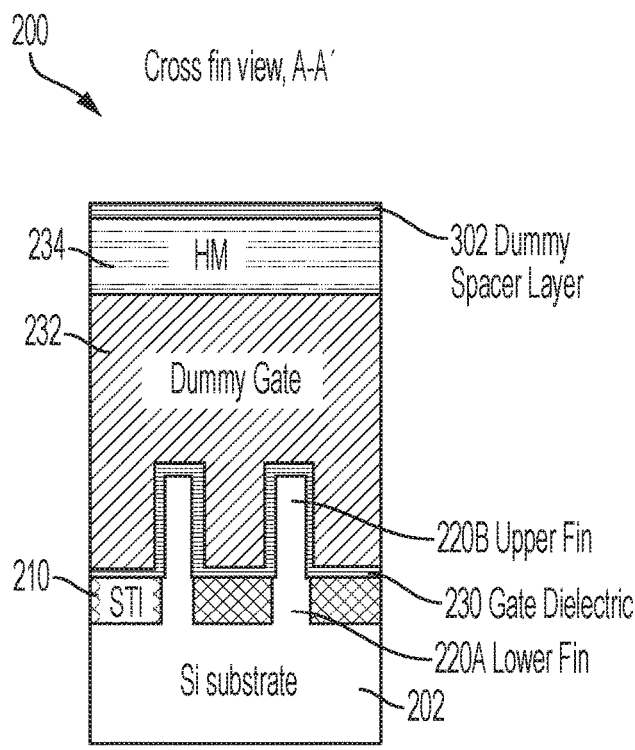
FIG. 4B depicts a cross-sectional view of the semiconductor structure shown in FIG. 4A taken along line A-A'.
Figure 4C:
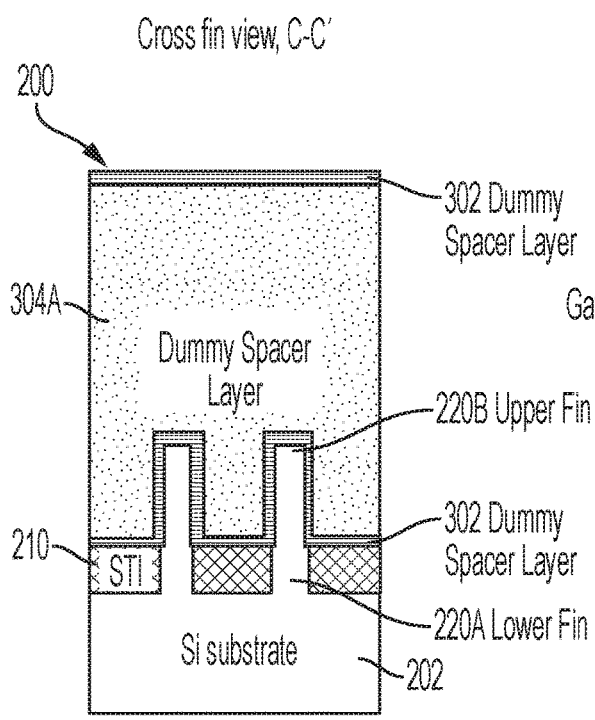
FIG. 4C depicts a cross-sectional view of the semiconductor structure shown in FIG. 4A taken along line C-C'.
Figure 4D:
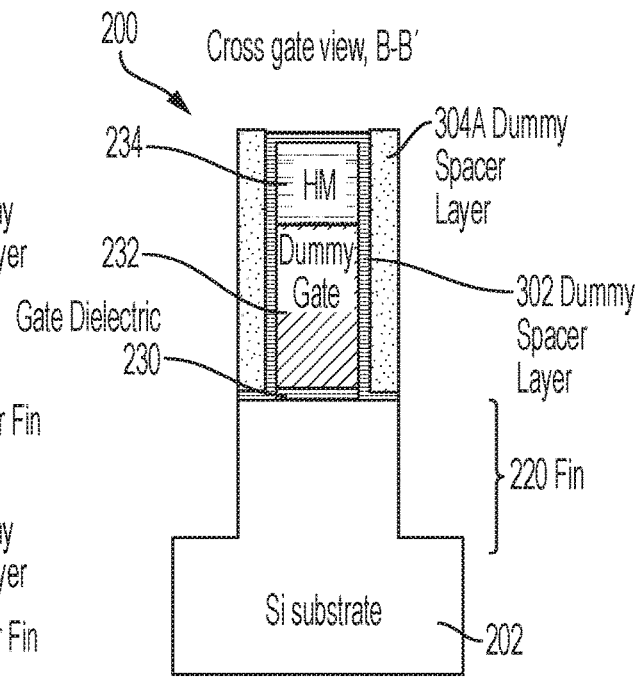
FIG. 4D depicts a cross-sectional view of the semiconductor structure shown in FIG. 4A taken along line B-B'.

FIG. 4A depicts a top-down view of the semiconductor structure 200 after additional fabrication operations in accordance with embodiments of the invention. FIG. 4B depicts a cross-sectional view of the semiconductor structure 200 shown in FIG. 4A taken along line A-A', FIG. 4C depicts a cross-sectional view of the semiconductor structure 200 shown in FIG. 4A taken along line C-C', and FIG. 4D depicts a cross-sectional view of the semiconductor structure 200 shown in FIG. 4A taken along line D-D'. As best shown in FIGS. 4A and 4D, a suitable etch process (e.g., a wet or dry directional etch process) has been used to remove the first layer 302 and the second layer 304 from horizontal surfaces of the structure 200 (except for the first layer 302 on a horizontal top surface of the HM 234), thereby forming dummy spacers 304A on sidewalls of the first layer 302. As best shown in FIG. 4D, after the dummy spacers 304A have been formed, the portions of fins 220 that are not under the first layer 302 and the gate dielectric 230 are recessed to form recessed spaces in which source or drain (S/D) regions 502, 504 (best shown in FIG. 5D) will be formed.

Figure 5A:
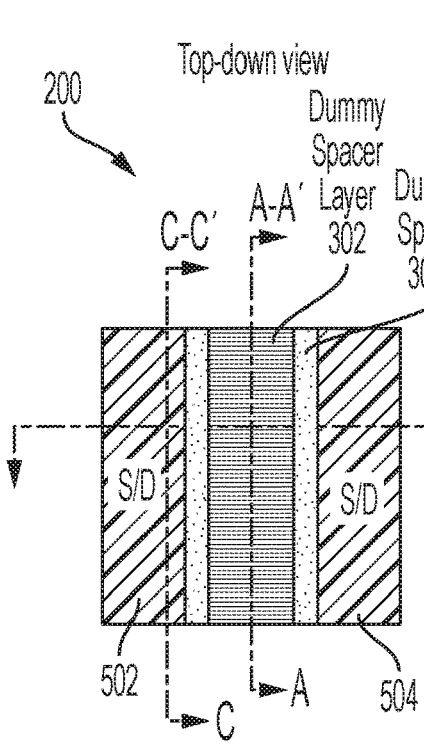
FIG. 5A depicts a top-down view of the semiconductor structure after fabrication operations in accordance with embodiments of the invention.
Figure 5B:
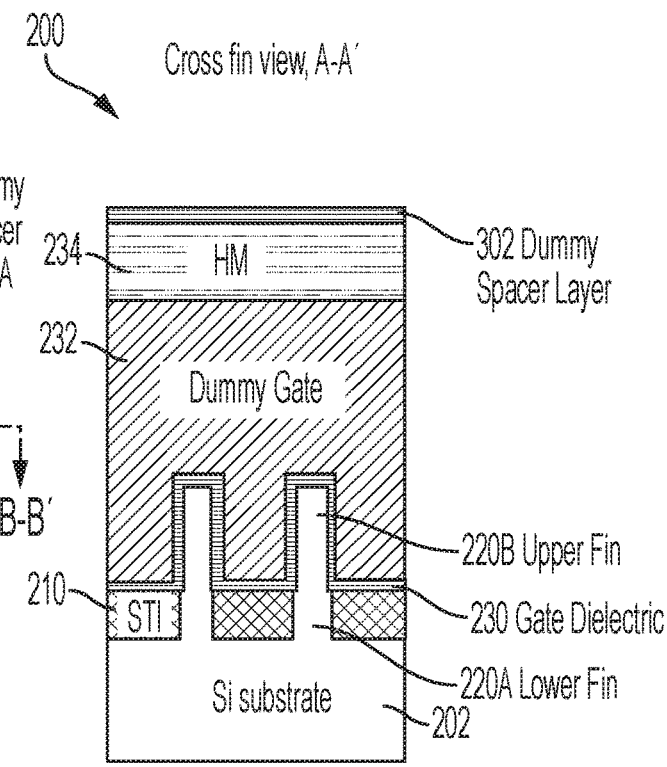
FIG. 5B depicts a cross-sectional view of the semiconductor structure shown in FIG. 5A taken along line A-A'.
Figure 5C:
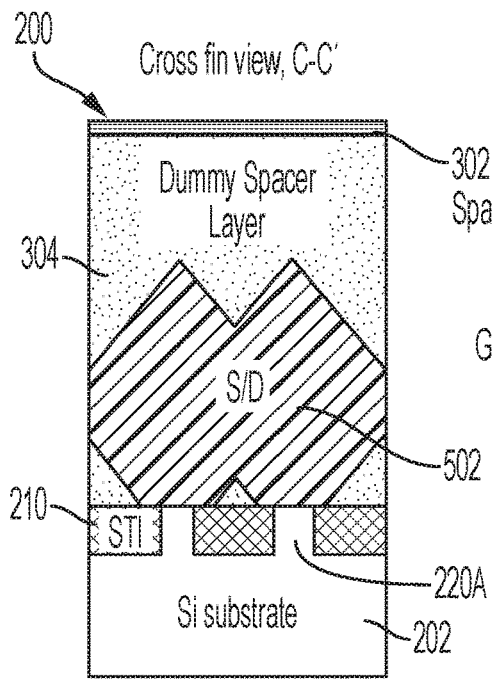
FIG. 5C depicts a cross-sectional view of the semiconductor structure shown in FIG. 5A taken along line C-C'.
Figure 5D:
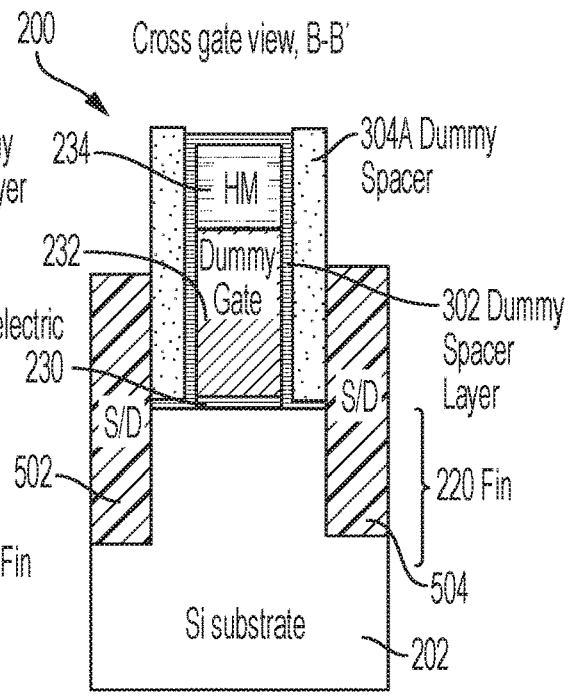
FIG. 5D depicts a cross-sectional view of the semiconductor structure shown in FIG. 5A taken along line B-B'.

FIG. 5A depicts a top-down view of the semiconductor structure 200 after additional fabrication operations in accordance with embodiments of the invention. FIG. 5B depicts a cross-sectional view of the semiconductor structure 200 shown in FIG. 5A taken along line A-A', FIG. 5C depicts a cross-sectional view of the semiconductor structure 200 shown in FIG. 5A taken along line C-C', and FIG. 5D depicts a cross-sectional view of the semiconductor structure 200 shown in FIG. 5A taken along line B-B'. As best shown in FIG. 5D, known fabrication operations have been used to form a doped S/D region 502 and a doped S/D region 504 on exposed surfaces that resulted from recessing the fin 220 as depicted in FIG. 4D. In accordance with aspects of the invention, the doped S/D regions 502, 504 are grown to a height that extends above the top surface of the fin upper fin region 220B. In accordance with aspects of the invention, the doped S/D regions 502, 504 are grown to a height that extends above the top surface of the upper fin 220B and below the top surface of the dummy gate 232. In accordance with aspects of the invention, the doped S/D regions 502, 504 are grown to a height that extends above the top surface of the upper fin 220B and about midway through the height of the portion of the dummy gate 232 that is above the upper fin region 220B.

The doped S/D regions 502, 504 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RT-CVD), metal organic chemical vapor deposition (MOCVD), low-pressure chemical vapor deposition (LPCVD), limited reaction processing CVD (LRPCVD), and MBE. In some embodiments of the invention, and depending on whether the final semiconductor device that will be formed from the semiconductor structure 200 will be a p-type FET (PFET) or an n-type FET (NFET), the doped S/D regions 502, 504 can be doped during deposition (in-situ doped) by adding dopants, n-type dopants (e.g., phosphorus or arsenic) or p-type dopants (e.g., Ga, B, $BF_2$, or Al) to a suitable dopant concentration level for the desired performance. A dopant drive-in anneal (e.g., a rapid thermal anneal (RTA) is performed to activate and drive in the dopants.

FIG. 6A depicts a top-down view of the semiconductor structure 200 after additional fabrication operations in accordance with embodiments of the invention. FIG. 6B depicts a cross-sectional view of the semiconductor structure 200 shown in FIG. 6A taken along line A-A', FIG. 6C depicts a cross-sectional view of the semiconductor structure 200 shown in FIG. 6A taken along line C-C', and FIG. 6D depicts a cross-sectional view of the semiconductor structure 200 shown in FIG. 6A taken along line B-B'. As best shown in FIGS. 6A and 6D, known fabrication operations have been used to selectively remove the first layer 302 and the dummy spacers 304A (shown in FIG. 5D) using, for example a wet etch process such as hot phosphoric acid. In accordance with aspects of the invention, the first layer 302 and the dummy spacers 304A are formed from materials that have sufficiently different etch selectivity from the remaining portions of the semiconductor structure 200 that will allow the first layer 301 and the dummy spacers 304A to be removed while leaving the remaining portions of the semiconductor structure 200 substantially intact. In embodiments of the invention, the first layer 302 is formed from an oxide (e.g., $SiO_2$), and the dummy spacers 304A are formed from a nitride (e.g., SiN). Removing the first layer 302 and the dummy spacers 304A results in the formation of cavities 602 between the dummy gate 232 and the SD regions 502, 504.

Figure 7A:
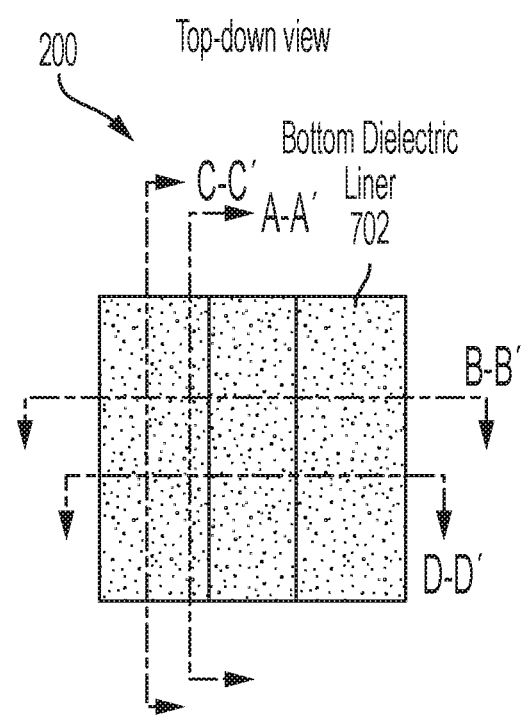
FIG. 7A depicts a top-down view of the semiconductor structure after fabrication operations in accordance with embodiments of the invention.

FIG. 7A depicts a top-down view of the semiconductor structure 200 after additional fabrication operations in accordance with embodiments of the invention. FIG. 7B depicts a cross-sectional view of the semiconductor structure 200 shown in FIG. 7A taken along line A-A', FIG. 7C depicts a cross-sectional view of the semiconductor structure 200 shown in FIG. 7A taken along line C-C', FIG. 7D depicts a cross-sectional view of the semiconductor structure 200 shown in FIG. 7A taken along line B-B', and FIG. 7E depicts a cross-sectional view of the semiconductor structure 200 shown in FIG. 7A taken along line D-D'. As best shown in FIGS. 7B, 7D, and 7E, a bottom dielectric liner 702 has been conformally deposited over the structure 200. The term "conformal" denotes that the thickness of the layer is substantially the same on all surfaces, or that the thickness variation is less than about 15% of the nominal thickness of the layer. The bottom dielectric liner 702 can be conformally deposited using, for example, a suitable chemical vapor deposition (CVD) process. Examples of suitable CVD processes for forming the bottom dielectric liner 702 include, but are not limited to, atmospheric pressure CVD (APCVD), low pressure CVD (LPCVD), plasma enhanced CVD (PECVD), metal-organic CVD (MOCVD), and combinations thereof. In embodiments of the invention, the bottom dielectric liner 702 can be deposited using a relatively low temperature (e.g., approximately 350° C.) plasma-enhanced chemical vapor deposition (PECVD) process.

The bottom dielectric liner 702 is conformally deposited such that the bottom dielectric liner 702 extends along sidewalls and bottom surfaces of the cavities 602 (shown in FIGS. 6A and 6C). The thickness of the bottom dielectric liner 702 and the width dimensions of the cavities 602 are selected such that, when the bottom dielectric liner 702 has been deposited along one sidewall, a bottom surface, and the opposing sidewall of a cavity 602, the bottom dielectric liner 702 merges (or pinches off) in the upper portions of the cavities 602 to create bottom spacers 702A within the cavities 602, wherein the bottom spacers 702A enclose and define encapsulated bottom air-gaps 704 within the cavities 602. In accordance with embodiments of the invention, and as best shown in FIG. 7B, the encapsulated bottom air-gap 704 includes lower air-gap regions 704A and upper air-gap regions 704B.

In some embodiments of the invention, the bottom dielectric liner 702 can be any dielectric material, such as a nitrogen containing dielectric, an oxide containing dielectric, or a combination thereof (e.g., silicon oxynitride) so long as the material selected for the bottom dielectric liner 702 allows for encapsulating the bottom air-gaps 704 within the cavities 602. In the embodiments of the invention depicted in the figures, the bottom dielectric liner 702 can be SiOC. Silicon nitride and silicon oxide are only some examples of dielectric material that are suitable for the bottom dielectric liner 702, and it is not intended that embodiments of the invention be limited to only these examples. For example, in some embodiments of the invention, the bottom dielectric liner 702 can include a low-k dielectric material. In embodiments of the invention, the low-k material that provides the bottom dielectric liner 702 can have a dielectric constant ranging from 1.0 to 3.5. In embodiments of the invention, the low-k material that provides the bottom dielectric liner 702 can have a dielectric constant ranging from 1.75 to 3.2. Examples of materials suitable for the low-k dielectric material that provides the bottom dielectric liner 702 can include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC), and combinations thereof.

As best shown in FIG. 7B, the encapsulated bottom air-gap 704 includes regions with relatively taller height dimensions and regions with relatively shorter height dimensions. As shown in FIG. 7E, the taller height dimensions are substantially defined by the height dimension of the S/D regions 502, 504 minus the thickness of the bottom dielectric liner 702 on the top surface of the STI region 210 and at the top of the cavities 602 (shown in FIGS. 6A and 6D). As shown in FIG. 7D, the shorter height dimensions of the encapsulated bottom air-gap regions 704 are substantially defined by the distance between the top surfaces of the fins 220 and the top surfaces of the S/D regions 502, 504 minus the thickness of the bottom dielectric liner 702 on the top surface of the fin 220 and at the top of the cavities 602. Accordingly, in accordance with aspects of the invention, the height of the S/D regions 502, 504 and the thickness of the bottom dielectric liner 702 are selected to substantially define the taller and shorter height dimensions of the encapsulated bottom air-gap 704. FIG. 7B also shows that portions of the encapsulated bottom air-gap 704 extend below the top surface of the fin 220, and more specifically the top surface of the upper fin 220B.

In accordance with aspects of the invention, the encapsulated bottom air gap 704 has regions that extend above a top surface of the upper fin 220B and below a top surface of the upper fin 220B, thereby providing a relatively large low-dielectric region that enhances electrical performance by reducing parasitic capacitance between the gate 902 (shown in FIGS. 9D and 9E) and the S/D regions 502, 504. The dielectric constant of air is about unity as compared to the dielectric constant of SiN which is about 7-7.5. Additionally, in embodiments of the invention, the bottom dielectric liner 702 can include a low-k dielectric material (e.g., SiOCN) to even further reduce the dielectric constant and in the cavities 602 (shown in FIG. 6D) and further enhance electrical performance by reducing parasitic capacitance between the gate 902 and the S/D regions 502, 504.

Figure 8A:
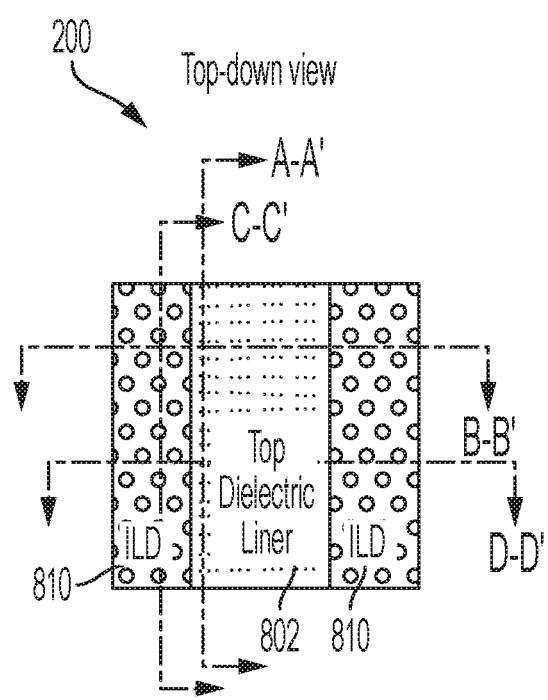
FIG. 8A depicts a top-down view of the semiconductor structure after fabrication operations in accordance with embodiments of the invention.
Figure 8B:
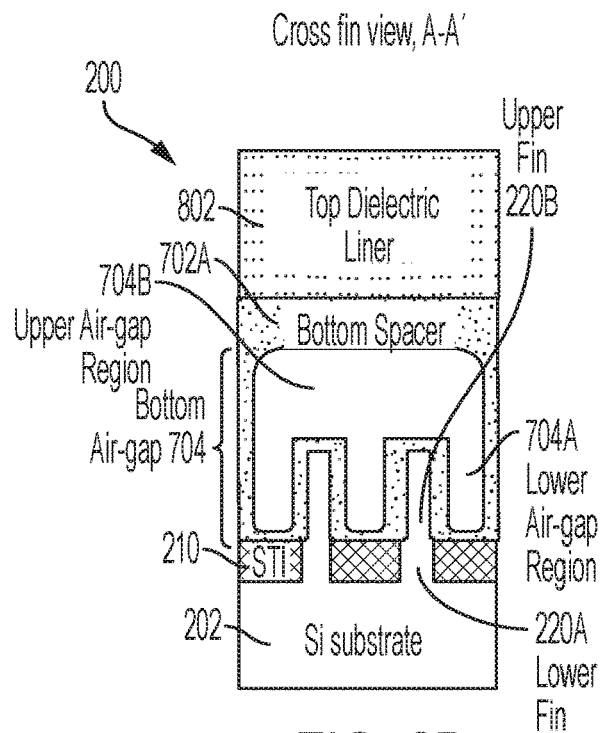
FIG. 8B depicts a cross-sectional view of the semiconductor structure shown in FIG. 8A taken along line A-A'.
Figure 8C:
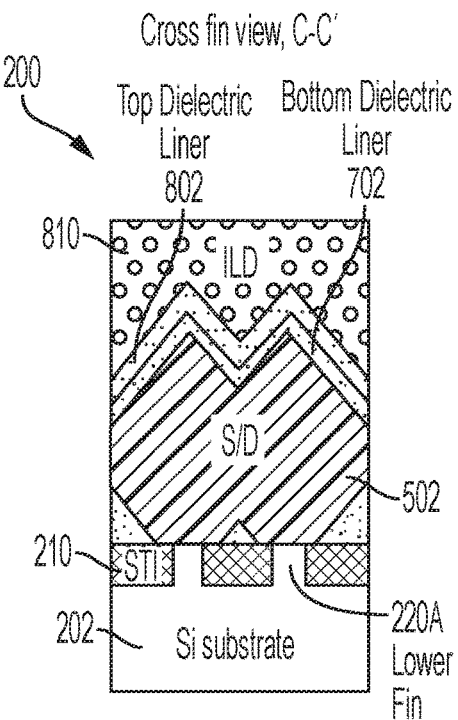
FIG. 8C depicts a cross-sectional view of the semiconductor structure shown in FIG. 8A taken along line C-C'.
Figure 8D:
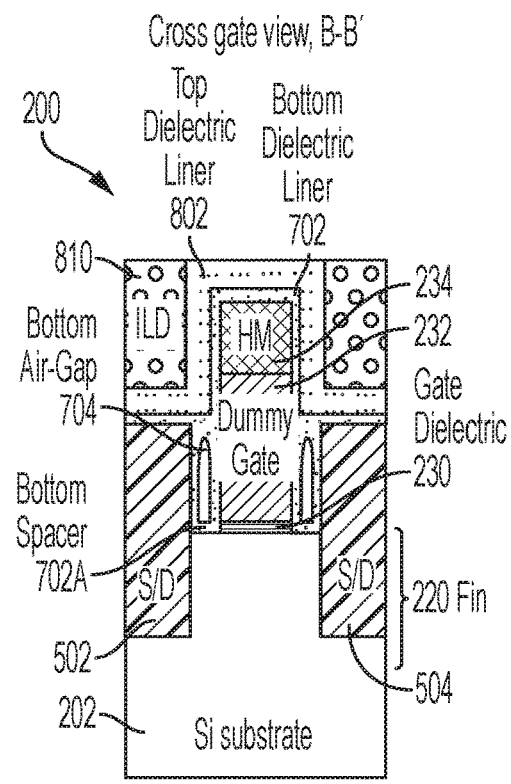
FIG. 8D depicts a cross-sectional view of the semiconductor structure shown in FIG. 8A taken along line B-B'.
Figure 8E:
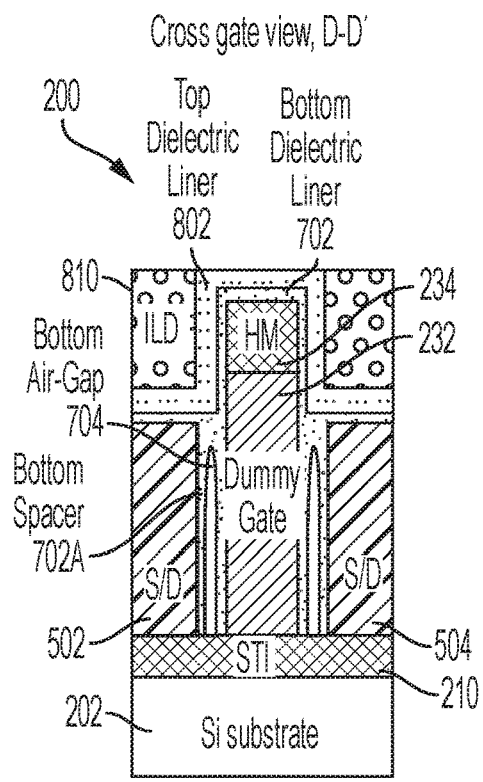
FIG. 8E depicts a cross-sectional view of the semiconductor structure shown in FIG. 8A taken along line D-D'.

FIG. 8A depicts a top-down view of the semiconductor structure 200 after fabrication operations in accordance with embodiments of the invention. FIG. 8B depicts a cross-sectional view of the semiconductor structure 200 shown in FIG. 8A taken along line A-A', FIG. 8C depicts a cross-sectional view of the semiconductor structure 200 shown in FIG. 8A taken along line C-C', FIG. 8D depicts a cross-sectional view of the semiconductor structure 200 shown in FIG. 8A taken along line B-B', and FIG. 8E depicts a cross-sectional view of the semiconductor structure 200 shown in FIG. 8A taken along line D-D'. As best shown in FIGS. 8C and 8D (or 8E), known fabrication operations have been used to conformally deposit a top dielectric liner 802 of dielectric material over the structure 200, and more specifically over the bottom dielectric liner 702. The top dielectric liner 802 can be conformally deposited using, for example, a suitable chemical vapor deposition (CVD) process. Examples of suitable CVD processes for forming the top dielectric liner 802 include, but are not limited to, atmospheric pressure CVD (APCVD), low pressure CVD (LPCVD), plasma enhanced CVD (PECVD), metal-organic CVD (MOCVD), and combinations thereof.

The top dielectric liner 802 is conformally deposited such that the top dielectric liner 802 extends along sidewalls of the dummy gates 232 and the HM 234 separated therefrom by the bottom dielectric liner 702. The portions of the top dielectric liner 802 that extends along sidewalls of the dummy gates 232 and the HM 234 act as a protective liner during formation of the S/D contacts 1302 (shown in FIGS. 13A-13D). In some embodiments of the invention, the top dielectric liner 802 can be any dielectric material, such as a nitrogen containing dielectric, an oxide containing dielectric, or a combination thereof.

As best shown in FIGS. 8C and 8D (or 8E), known fabrication operations have been used to form an interlayer dielectric (ILD) layer 802, configured and arranged as shown. The ILD 802 can be made of any suitable dielectric material, such as, for example, porous silicates, carbon doped oxides, silicon dioxide, silicon nitrides, silicon oxynitrides, or other dielectric materials. Any known manner of forming the ILD 802 can be utilized. The ILD 802 can be formed using, for example, CVD, PECVD, ALD, flowable CVD (flowable oxide), spin-on dielectrics, or PVD. In embodiments of the invention, the ILD 802 is recessed to a level that exposes a top surface of the top dielectric liner 802 using any suitable techniques, such as, for example, an oxide recess and/or CMP.

Figure 9A:
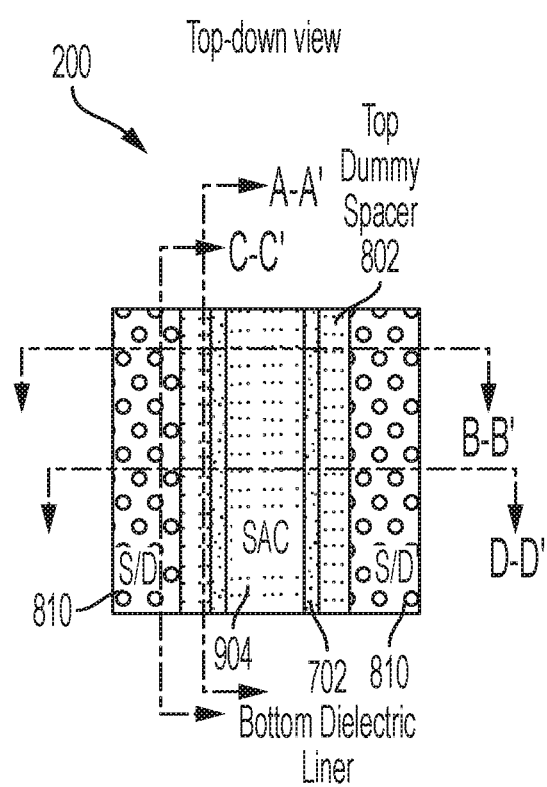
FIG. 9A depicts a top-down view of the semiconductor structure after fabrication operations in accordance with embodiments of the invention.
Figure 9B:
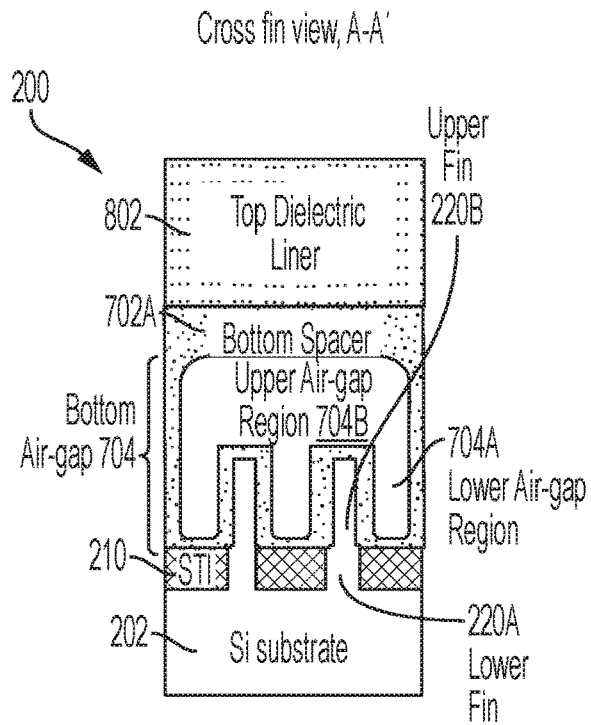
FIG. 9B depicts a cross-sectional view of the semiconductor structure shown in FIG. 9A taken along line A-A'.
Figure 9C:
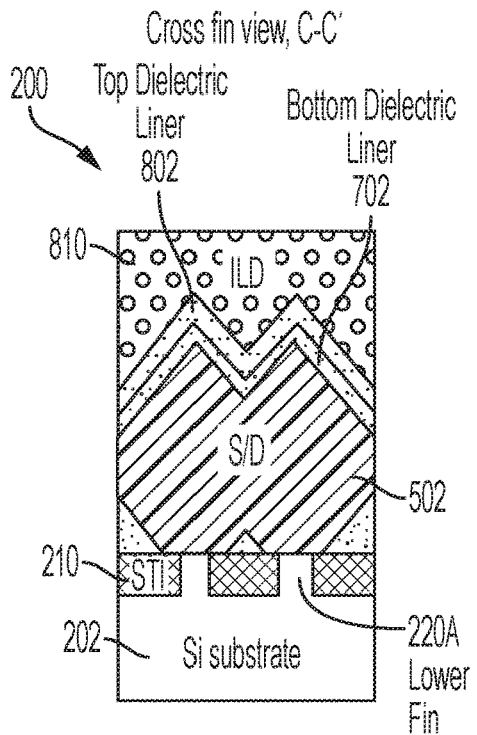
FIG. 9C depicts a cross-sectional view of the semiconductor structure shown in FIG. 9A taken along line C-C'.
Figure 9D:
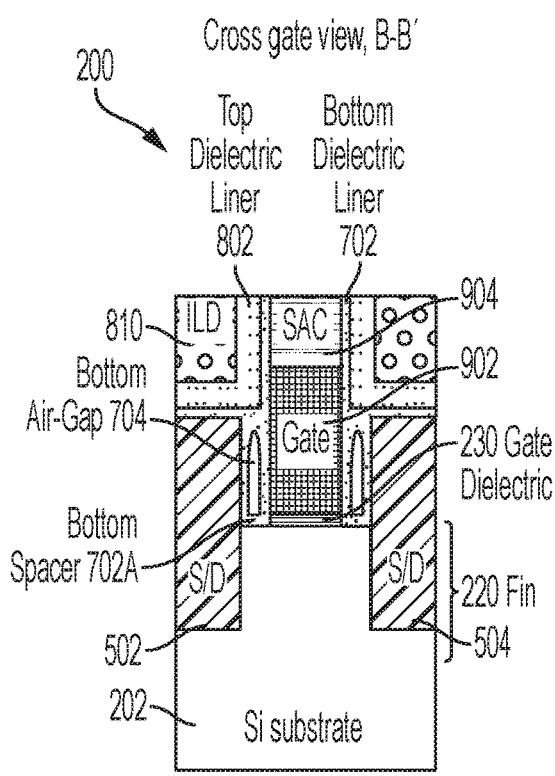
FIG. 9D depicts a cross-sectional view of the semiconductor structure shown in FIG. 9A taken along line B-B'.
Figure 9E:
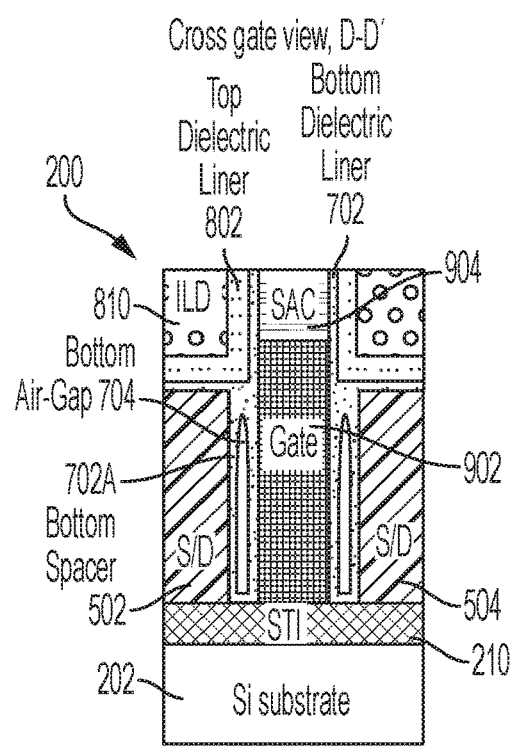
FIG. 9E depicts a cross-sectional view of the semiconductor structure shown in FIG. 9A taken along line D-D'.

FIG. 9A depicts a top-down view of the semiconductor structure 200 after fabrication operations in accordance with embodiments of the invention. FIG. 9B depicts a cross-sectional view of the semiconductor structure 200 shown in FIG. 9A taken along line A-A', FIG. 9C depicts a cross-sectional view of the semiconductor structure 200 shown in FIG. 9A taken along line C-C', FIG. 9D depicts a cross-sectional view of the semiconductor structure 200 shown in FIG. 9A taken along line B-B', and FIG. 9E depicts a cross-sectional view of the semiconductor structure 200 shown in FIG. 9A taken along line D-D'. As best shown in FIGS. 9D and 9E, known fabrication operations have been used to recess the exposed surfaces of the nanosheet-based structure 200, thereby exposing a top surface of the top dielectric liner 802. Known fabrication operations have also been used to recess the exposed surfaces of the bottom dielectric liner 702 and the top dielectric liner 802 to expose a top surface of the HM 234.

Known fabrication operations have also been used to remove the HM 234 and the dummy gates 232 (e.g., a reactive ion etch (RIE)) and replace the dummy gates 232 with metal gates 902 using a replacement metal gate (RMG) process. In general, a RMG process uses the dummy gates 232 (shown in FIGS. 8D and 8E) as a placeholder for the metal gate stack 902 until the final fabrication operations in which the dummy gates 232 are replaced with the metal gates 902. The dummy gates 232 are fabricated from a material (e.g., a-Si) that is more compatible with CMOS processing operations than gate metals. The metal gates 902 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

The gate dielectric 230 can include interfacial layers (IL) and high-k dielectric layers. In some embodiments of the invention, the high-k dielectric layers can modify the work function of the metal gates 902. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In some embodiments of the invention, work function layers (not depicted) are formed between the gate dielectric 230 and the metal gates 902. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments of the invention, the work function layers further modify the work function of the metal gate.

Known fabrication operations have been used to deposit a layer of capping material that fills in the space over the gate stack 902 and between exposed sidewall surfaces of the bottom dielectric liner 702 to form a self-aligned cap (SAC) 904. In some embodiments of the invention, the layer of capping material is formed using a CVD, PECVD, ALD, PVD, chemical solution deposition, or other like process. The capping material can be any suitable material including, for example, a nitride such as SiN or SiBCN. The semiconductor structure 200 is planarized to the level shown in FIGS. 9B-9E, thereby exposing top surfaces of the ILD 802, the top dielectric liner 802, the bottom dielectric liner 702, and the SAC 904.

Figure 10A:
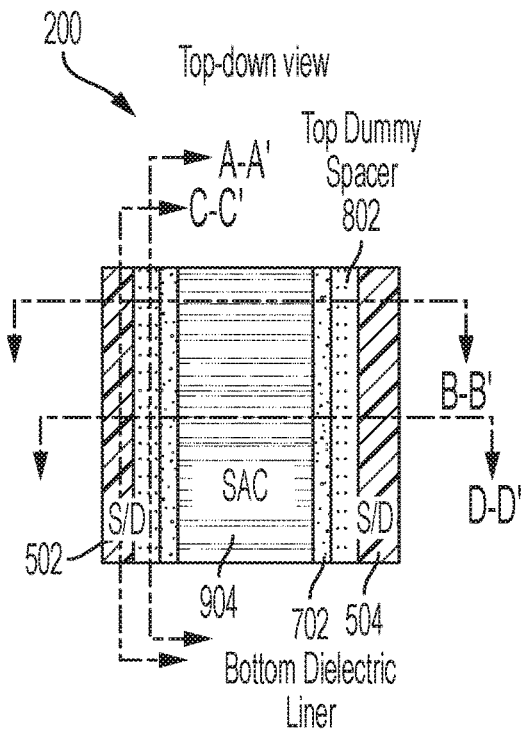
FIG. 10A depicts a top-down view of the semiconductor structure after fabrication operations in accordance with embodiments of the invention.
Figure 10B:
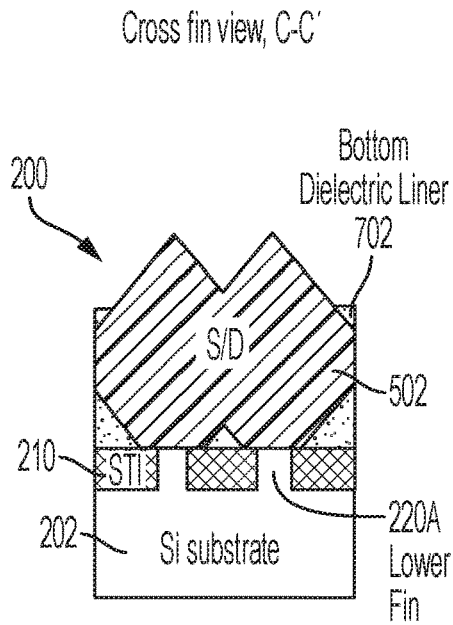
FIG. 10B depicts a cross-sectional view of the semiconductor structure shown in FIG. 10A taken along line C-C'.
Figure 10C:
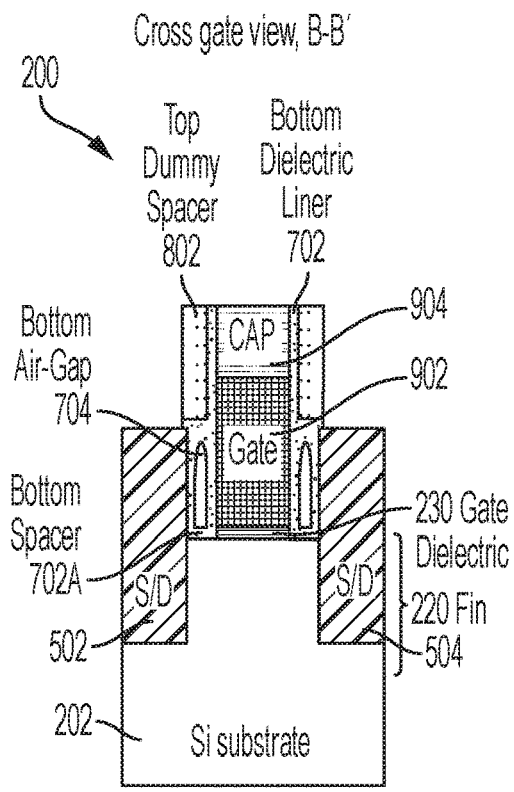
FIG. 10C depicts a cross-sectional view of the semiconductor structure shown in FIG. 10A taken along line B-B'.
Figure 10D:
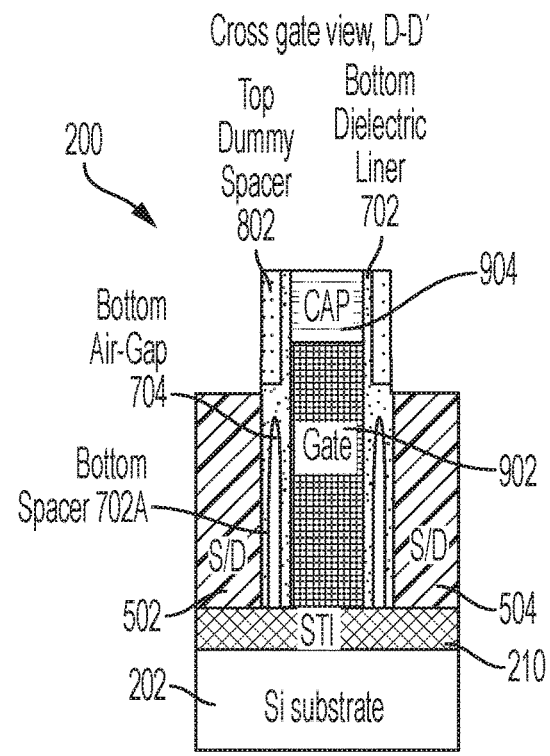
FIG. 10D depicts a cross-sectional view of the semiconductor structure shown in FIG. 10A taken along line D-D'.

FIG. 10A depicts a top-down view of the semiconductor structure 200 after fabrication operations in accordance with embodiments of the invention. FIG. 10B depicts a cross-sectional view of the semiconductor structure 200 shown in FIG. 10A taken along line C-C', FIG. 10C depicts a cross-sectional view of the semiconductor structure 200 shown in FIG. 10A taken along line B-B', and FIG. 10D depicts a cross-sectional view of the semiconductor structure 200 shown in FIG. 10A taken along line D-D'. As best shown in FIGS. 10B, 10C, and 10D, known fabrication operations (e.g., a directional oxide recess) are used to remove the ILD 810, the top dielectric liner 802, and the bottom dielectric liner 702 from the non-vertical surfaces of the semiconductor structure 200, thereby exposing top surfaces of the S/D regions 502, 504.

Figure 11A:
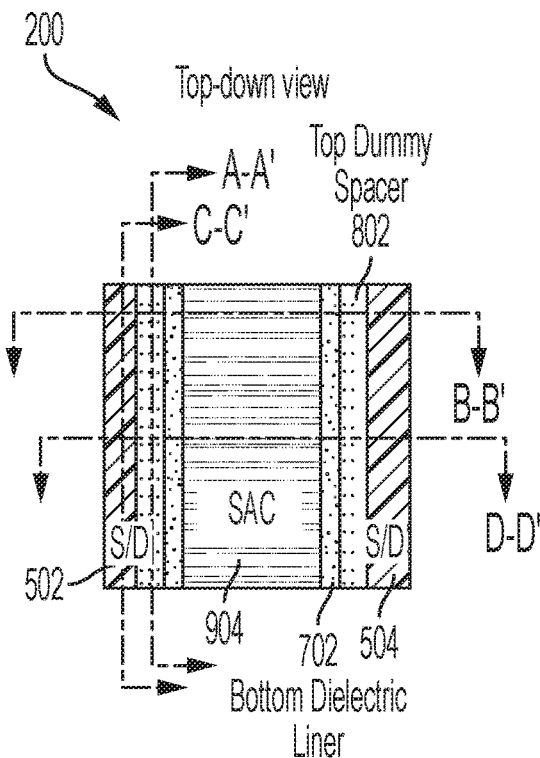
FIG. 11A depicts a top-down view of the semiconductor structure after fabrication operations in accordance with embodiments of the invention.
Figure 11B:
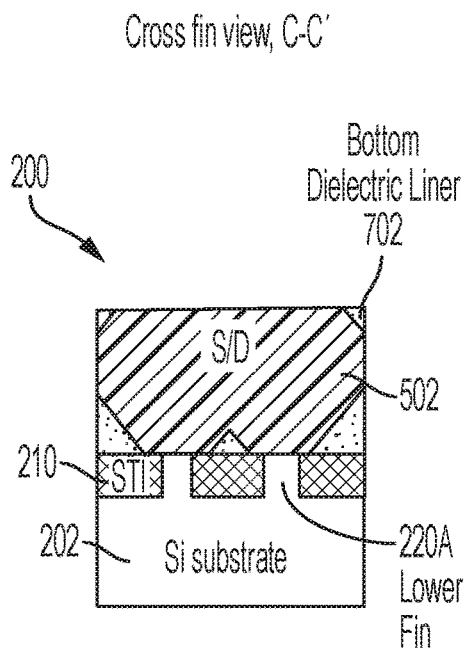
FIG. 11B depicts a cross-sectional view of the semiconductor structure shown in FIG. 11A taken along line C-C'.
Figure 11C:
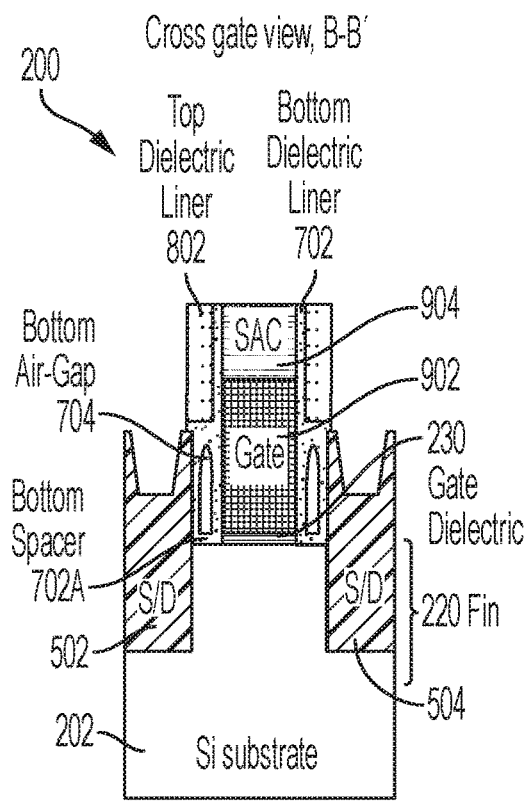
FIG. 11C depicts a cross-sectional view of the semiconductor structure shown in FIG. 11A taken along line B-B'.
Figure 11D:
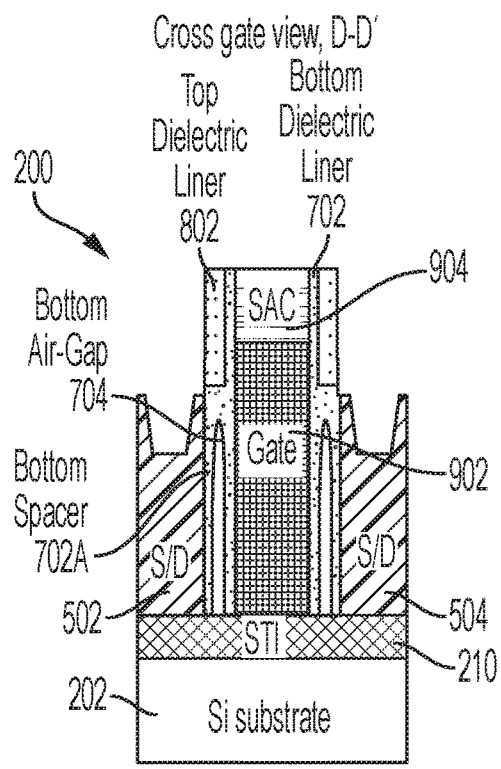
FIG. 11D depicts a cross-sectional view of the semiconductor structure shown in FIG. 11A taken along line D-D'.

FIG. 11A depicts a top-down view of the semiconductor structure 200 after additional fabrication operations in accordance with embodiments of the invention. FIG. 11B depicts a cross-sectional view of the semiconductor structure 200 shown in FIG. 11A taken along line C-C', FIG. 11C depicts a cross-sectional view of the semiconductor structure 200 shown in FIG. 11A taken along line B-B', and FIG. 11D depicts a cross-sectional view of the semiconductor structure 200 shown in FIG. 11A taken along line D-D'. As best shown in FIGS. 11C and 11D, known fabrication operations have been used to directionally recess or etch exposed surfaces of the S/D regions 502, 504 in an inwardly sloped direction in order to avoid breaching the adjacent encapsulated bottom air gaps 704. In general, when a material is attacked by a liquid or vapor etchant, it is removed isotropically (uniformly in all directions), anisotropically (uniformity in vertical direction), or partially anisotropically (at angles with respect to the etched surface). Liquid etchants etch crystalline materials at different rates depending upon which crystal face is exposed to the etchant, and there is a large difference in the etch rate depending on the silicon crystalline plane. In materials such as silicon, this effect can allow for very high anisotropy, which can be leveraged to perform a directional, highly anisotropic etch that results in the sloped etch planes shown in FIGS. 11C and 11D. For example etching a (100) silicon wafer would result in a pyramid shaped etch pit of the type shown in FIGS. 11C and 11D. The etched wall will be sloped or angled with respect to the flat horizontal plane of the wafer. The angle is expect to be about 54.7°.

Figure 12A:
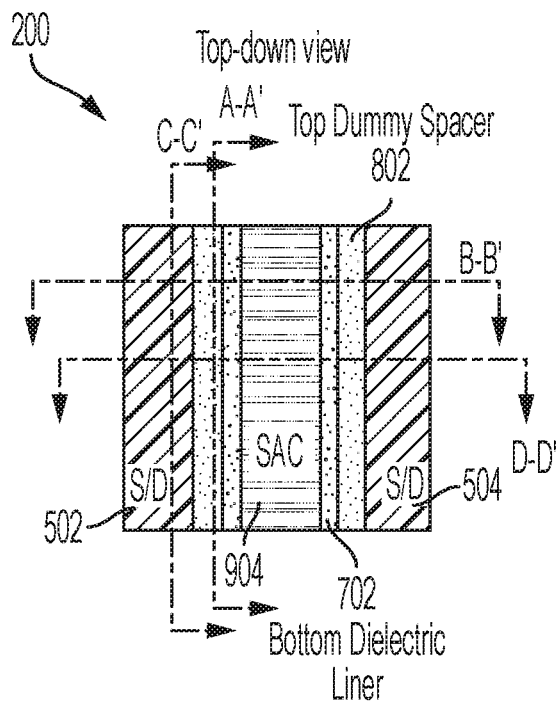
FIG. 12A depicts a top-down view of the semiconductor structure after fabrication operations in accordance with embodiments of the invention.
Figure 12B:
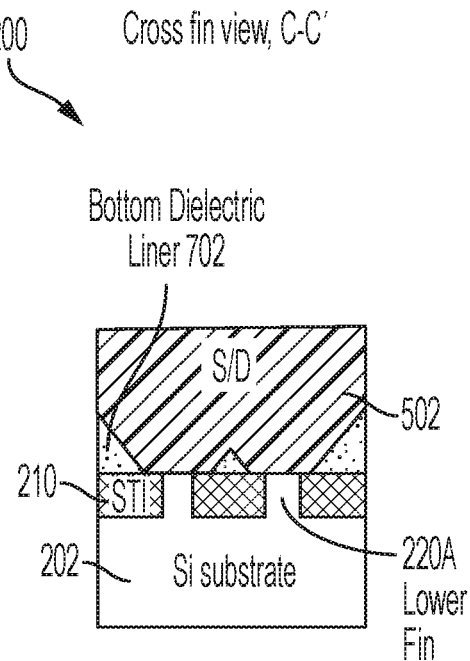
FIG. 12B depicts a cross-sectional view of the semiconductor structure shown in FIG. 12A taken along line C-C'.
Figure 12C:
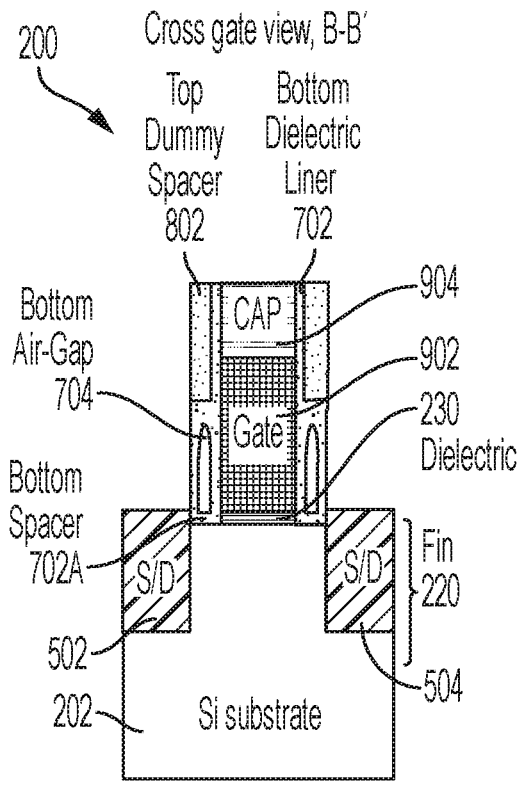
FIG. 12C depicts a cross-sectional view of the semiconductor structure shown in FIG. 12A taken along line B-B'.
Figure 12D:
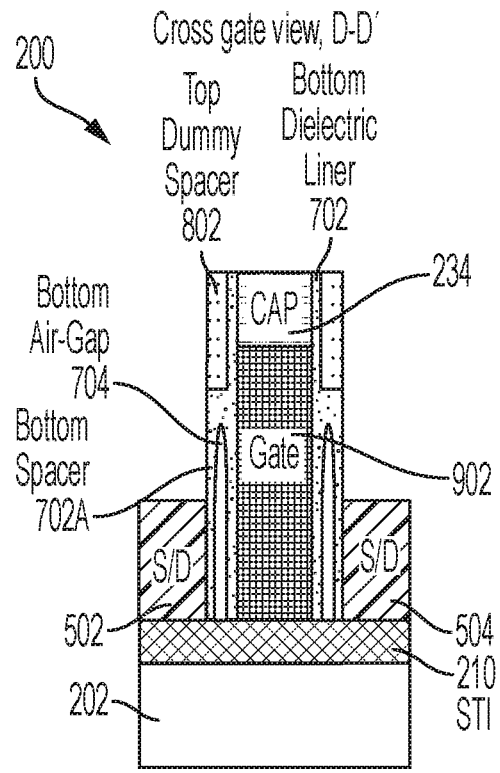
FIG. 12D depicts a cross-sectional view of the semiconductor structure shown in FIG. 12A taken along line D-D'.

FIG. 12A depicts a top-down view of the semiconductor structure 200 after additional fabrication operations in accordance with embodiments of the invention. FIG. 12B depicts a cross-sectional view of the semiconductor structure 200 shown in FIG. 12A taken along line C-C', FIG. 12C depicts a cross-sectional view of the semiconductor structure 200 shown in FIG. 12A taken along line B-B', and FIG. 12D depicts a cross-sectional view of the semiconductor structure 200 shown in FIG. 12A taken along line D-D'. As best shown in FIGS. 12B, 12C, and 12D, known fabrication operations have been used to further recess the S/D regions 502, 504. In embodiments of the invention, the S/D regions 502, 504 are recessed such that the top surface of the S/D regions 502, 504 is at substantially the same level as the top surface of the fin 220. In embodiments of the invention, the S/D regions 502, 504 are etched using an isotropic etc that etches the exposed surfaces of the S/D regions 502, 504 in all directions.

Figures 13A, 13B:
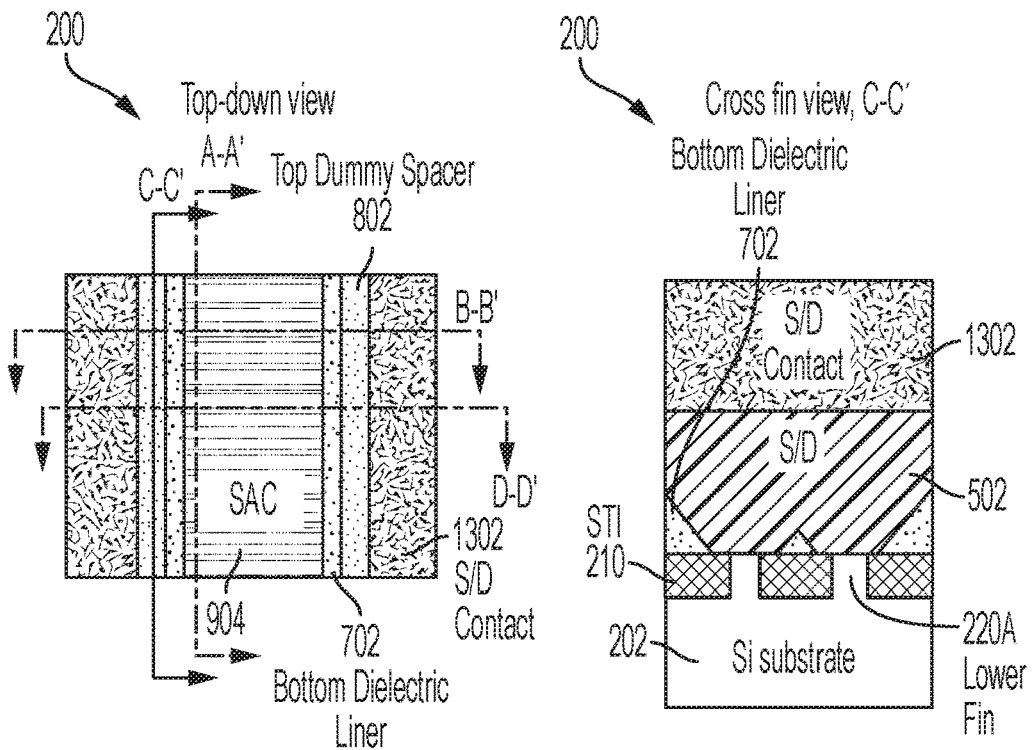
FIG. 13A depicts a top-down view of the semiconductor structure after fabrication operations in accordance with embodiments of the invention.
FIG. 13B depicts a cross-sectional view of the semiconductor structure shown in FIG. 13A taken along line C-C'.
Figures 13C, 13D:
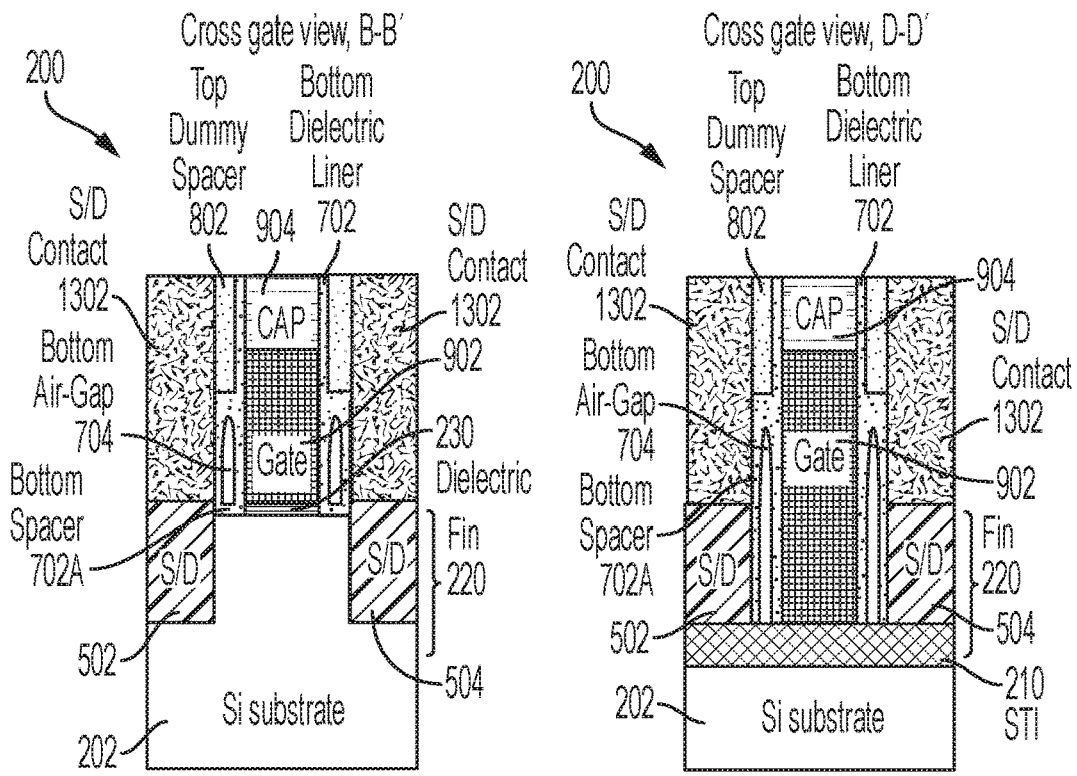
FIG. 13C depicts a cross-sectional view of the semiconductor structure shown in FIG. 13A taken along line B-B'.
FIG. 13D depicts a cross-sectional view of the semiconductor structure shown in FIG. 13A taken along line D-D'.

FIG. 13A depicts a top-down view of the semiconductor structure 200 after additional fabrication operations in accordance with embodiments of the invention. FIG. 13B depicts a cross-sectional view of the semiconductor structure 200 shown in FIG. 13A taken along line C-C', FIG. 13C depicts a cross-sectional view of the semiconductor structure 200 shown in FIG. 13A taken along line B-B', and FIG. 13D depicts a cross-sectional view of the semiconductor structure 200 shown in FIG. 13A taken along line D-D'. As best shown in FIGS. 13C and 13D, known semiconductor fabrication processes have been used to deposit S/D contact structures 1302 in S/D contact trenches (not shown) positioned over the S/D regions 502, 504. In embodiments of the invention the S/D contact trenches can be formed by depositing additional ILD over the structure 200 then patterning and etching the ILD to form the S/D contact trenches over the S/D regions 502, 504. The S/D contact structures 1302 can include a contact liner (not shown), which is configured and arranged to minimize contact resistance. The "bulk" contact (or fill material) portion of the contact structure 1302 can include conducting metal(s), which can be the same for both the n-type S/D and the p-type S/D. The metal contact fill can be tungsten (W), aluminum (Al), copper (Cu), or cobalt (Co). The contact structure 1302 can further include a barrier layer (not shown). The barrier layer can be titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with S/D regions 502, 504. In embodiments of the invention, the liner layer and the barrier layer can be conformally deposited in the S/D contact trenches by ALD, CVD, MOCVD, PECVD, or combinations thereof. In embodiments of the invention, the metal fill of the contact structure 1302 can be formed in the S/D contact trenches by ALD, CVD, and/or PVD.

Figure 14A:
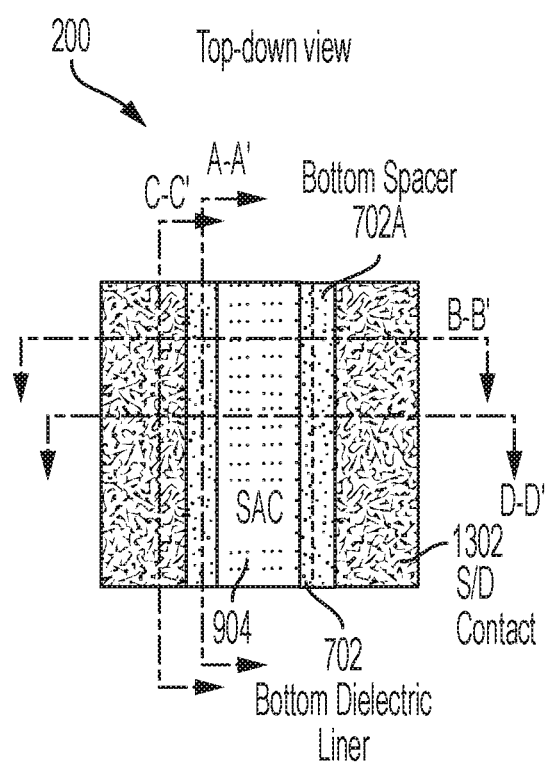
FIG. 14A depicts a top-down view of the semiconductor structure after fabrication operations in accordance with embodiments of the invention.
Figure 14B:
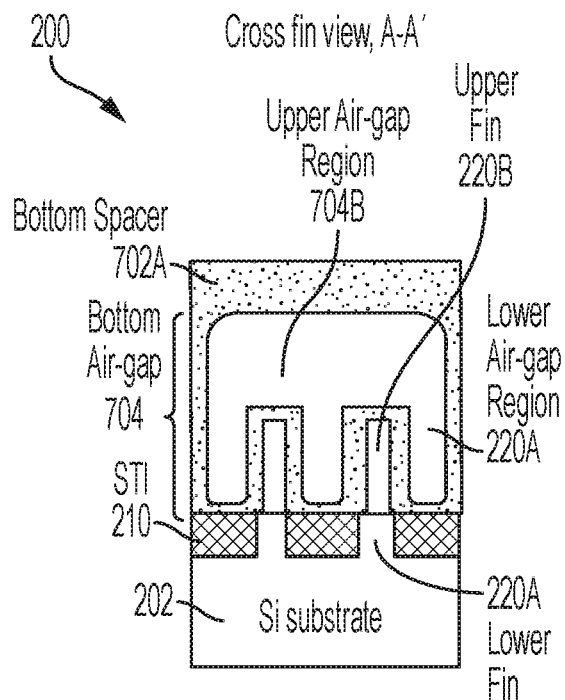
FIG. 14B depicts a cross-sectional view of the semiconductor structure shown in FIG. 14A taken along line A-A'.
Figure 14C:
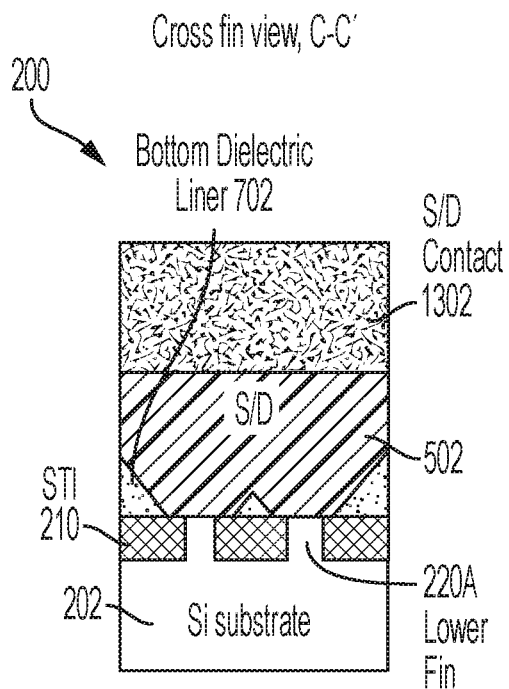
FIG. 14C depicts a cross-sectional view of the semiconductor structure shown in FIG. 14A taken along line C-C'.
Figure 14D:
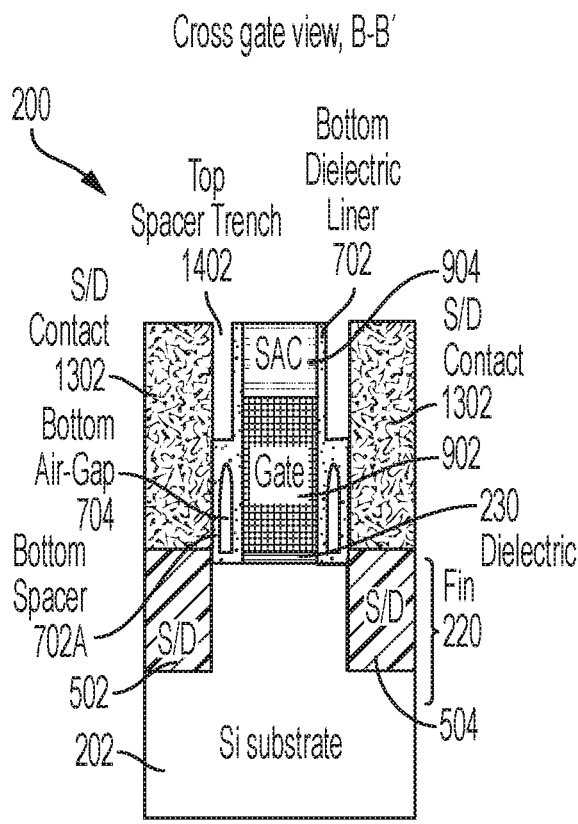
FIG. 14D depicts a cross-sectional view of the semiconductor structure shown in FIG. 14A taken along line B-B'.
Figure 14E:
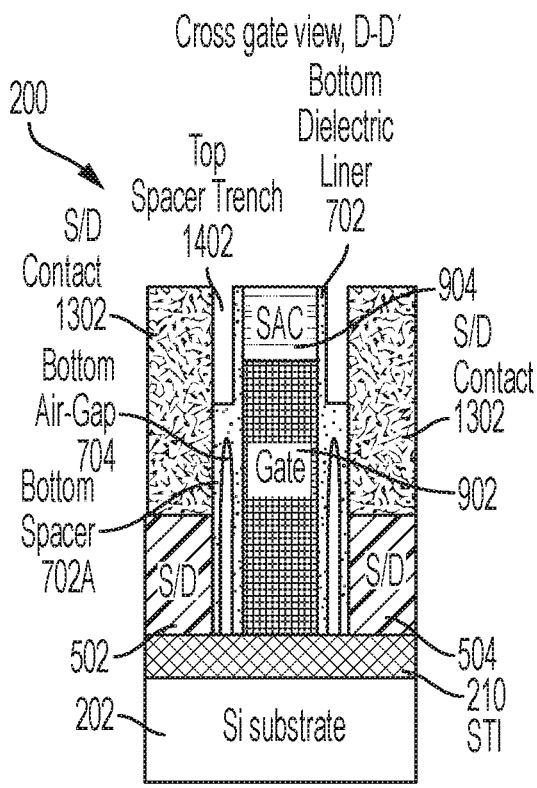
FIG. 14E depicts a cross-sectional view of the semiconductor structure shown in FIG. 14A taken along line D-D'.

FIG. 14A depicts a top-down view of the semiconductor structure 200 after additional fabrication operations in accordance with embodiments of the invention. FIG. 14B depicts a cross-sectional view of the semiconductor structure 200 shown in FIG. 14A taken along line A-A', FIG. 14C depicts a cross-sectional view of the semiconductor structure 200 shown in FIG. 14A taken along line C-C', FIG. 14D depicts a cross-sectional view of the semiconductor structure 200 shown in FIG. 14A taken along line B-B', and FIG. 14E depicts a cross-sectional view of the semiconductor structure 200 shown in FIG. 14A taken along line D-D'. As best shown in FIGS. 14D and 14E, known fabrication operations have be used to recess/remove the top dielectric liner 802, thereby creating a top spacer trench 1402.

Figure 15A:
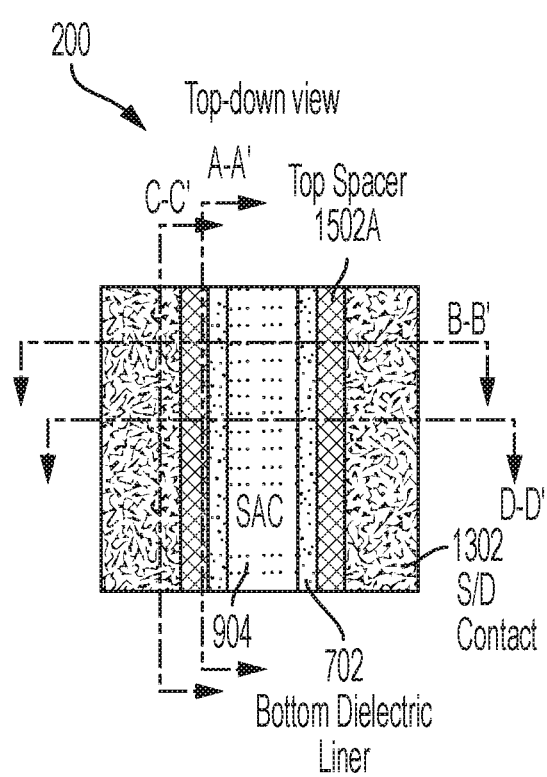
FIG. 15A depicts a top-down view of the semiconductor structure after fabrication operations in accordance with embodiments of the invention.
Figure 15B:
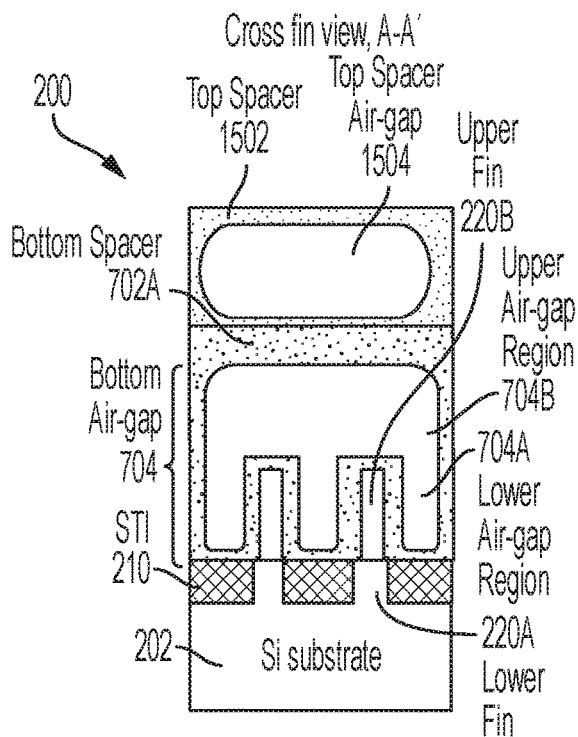
FIG. 15B depicts a cross-sectional view of the semiconductor structure shown in FIG. 15A taken along line A-A'.
Figure 15C:
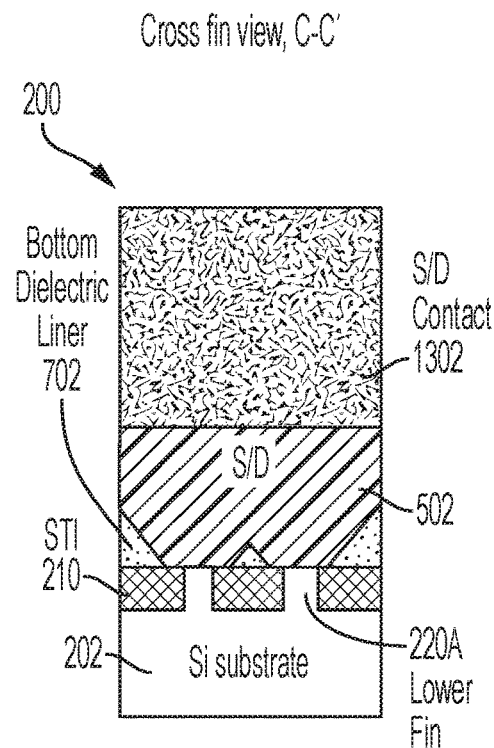
FIG. 15C depicts a cross-sectional view of the semiconductor structure shown in FIG. 15A taken along line C-C'.
Figure 15D:
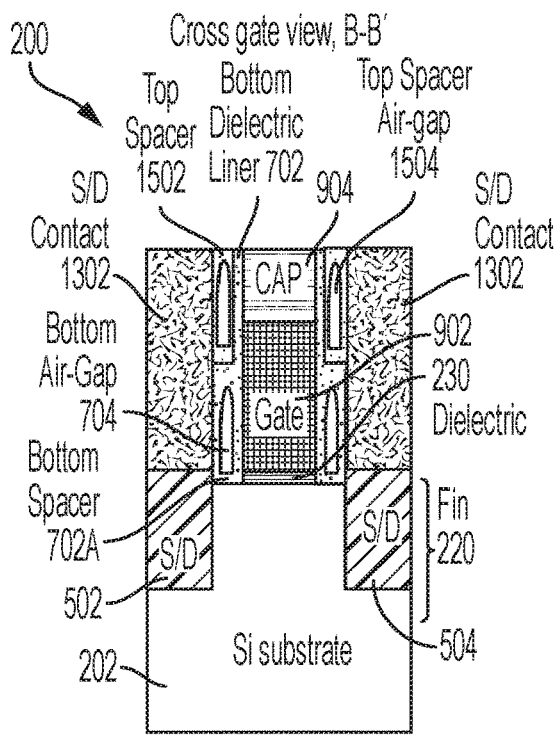
FIG. 15D depicts a cross-sectional view of the semiconductor structure shown in FIG. 15A taken along line B-B'.
Figure 15E:
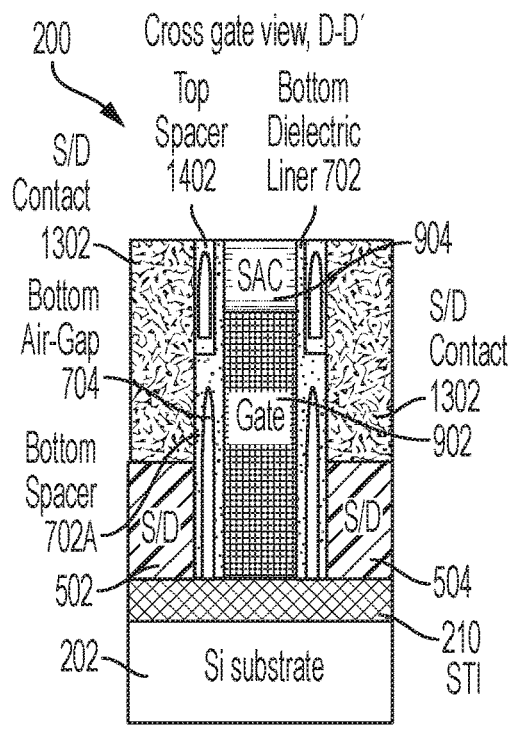

FIG. 15A depicts a top-down view of the semiconductor structure 200 after additional fabrication operations in accordance with embodiments of the invention. FIG. 15B depicts a cross-sectional view of the semiconductor structure 200 shown in FIG. 15A taken along line A-A', FIG. 15C depicts a cross-sectional view of the semiconductor structure 200 shown in FIG. 15A taken along line C-C', FIG. 15D depicts a cross-sectional view of the semiconductor structure 200 shown in FIG. 15A taken along line B-B', and FIG. 15E depicts a cross-sectional view of the semiconductor structure 200 shown in FIG. 15A taken along line D-D'. As best shown in FIGS. 15B, 15D, and 15E, top spacers 1502 are formed in the top spacer trenches 1402 (shown in FIGS. 14D and 14E) by conformally depositing a layer of dielectric material (e.g., SiBCN) within the top spacer trenches 1402 using, for example, a suitable chemical vapor deposition (CVD) process. Examples of suitable CVD processes for forming the layer of dielectric material include, but are not limited to, atmospheric pressure CVD (APCVD), low pressure CVD (LPCVD), plasma enhanced CVD (PECVD), metal-organic CVD (MOCVD), and combinations thereof.

The layer of dielectric material is conformally deposited in the top spacer trenches 1402 (shown in FIGS. 14D and 14E) such that the layer of dielectric material extends along sidewalls and bottom surfaces of the top spacer trenches 1402. The thickness of the layer of dielectric material and the width dimensions of the top spacer trenches 1402 are selected such that, when the layer of dielectric material has been deposited along one sidewall, a bottom surface, and the opposing sidewall of the top spacer trench 1402, the layer of dielectric material merges (or pinches off) in the upper portions of the top spacer trenches 1402 to enclose and define top spacers air gaps 1504 within the top spacers 1502.

In some embodiments of the invention, the top spacers 1502 can be any dielectric material, such as a nitrogen containing dielectric, an oxide containing dielectric, or a combination thereof, such as silicon oxynitride, so long as the material selected for the top spacers 1502 allows for encapsulating the top spacer air gaps 1504 within the top spacers 1502. In the embodiments of the invention depicted in the figures, the top spacers 1502 are SiBCN. Silicon nitride and silicon oxide are only some examples of dielectric material that are suitable for the top spacers 1502, and it is not intended that embodiments of the invention be limited to only these examples. For example, in some embodiments of the invention, the top spacers 1502 can include a low-k dielectric material. In embodiments of the invention, the low-k material of the top spacers 1502 can have a dielectric constant ranging from 1.0 to 3.5. In embodiments of the invention, the low-k material can have a dielectric constant ranging from 1.75 to 3.2. Examples of materials suitable for the low-k dielectric material can include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC), and combinations thereof.

As best shown in FIGS. 15D and 15E, the encapsulated top spacer air-gap 1504 is positioned such that a top portion of the S/D contacts 1302 is on one side of the top spacer air-gap 1504, and is further positioned such that the SAC 904 and a top portion of the metal gate structure 902 is on an opposite side of the top spacer air-gap 1504.

Figure 16A:
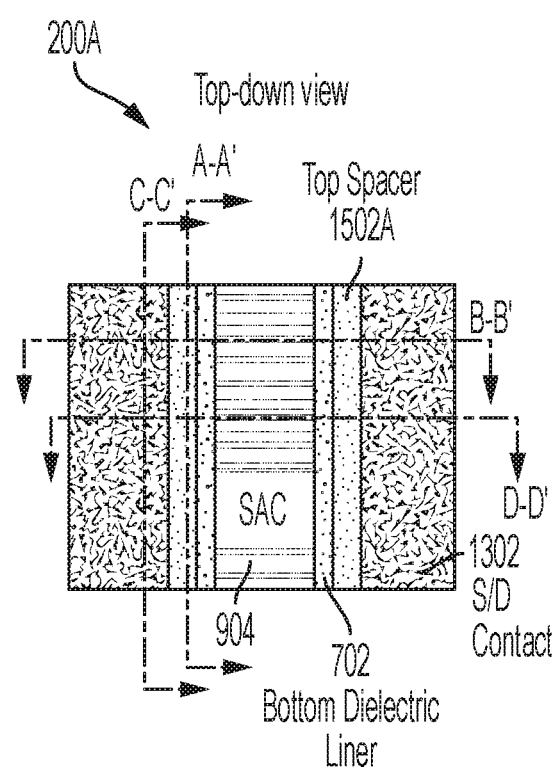
FIG. 16A depicts a top-down view of the semiconductor structure after fabrication operations in accordance with embodiments of the invention.

FIG. 16A depicts a top-down view of a semiconductor structure 200A after fabrication operations in accordance with embodiments of the invention. FIG. 16B depicts a cross-sectional view of the semiconductor structure 200A shown in FIG. 16A taken along line A-A', FIG. 16C depicts a cross-sectional view of the semiconductor structure 200A shown in FIG. 16A taken along line C-C', FIG. 16D depicts a cross-sectional view of the semiconductor structure 200A shown in FIG. 16A taken along line B-B', and FIG. 16E depicts a cross-sectional view of the semiconductor structure 200A shown in FIG. 16A taken along line D-D'. The semiconductor structure 200A is formed using substantially the same fabrication operations used to form the semiconductor structure 200 (shown in FIGS. 2A-15E) with the following differences. As best shown in FIGS. 16D and 16E, the top spacers 1502A are formed as solid structures with no air gaps. Any suitable deposition process can be used to form the top spacers 1502A.

Figure 17A:
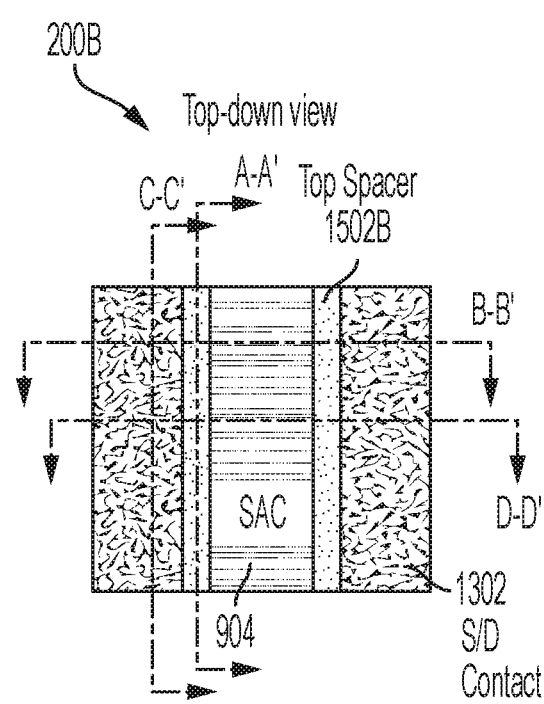
FIG. 17A depicts a top-down view of the semiconductor structure after fabrication operations in accordance with embodiments of the invention.
Figure 17B:
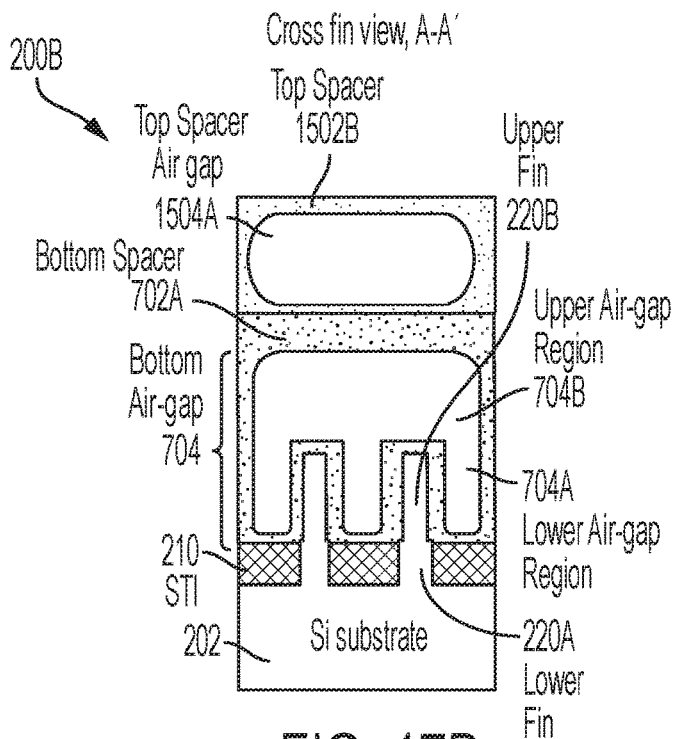
FIG. 17B depicts a cross-sectional view of the semiconductor structure shown in FIG. 17A taken along line A-A'.
Figure 17C:
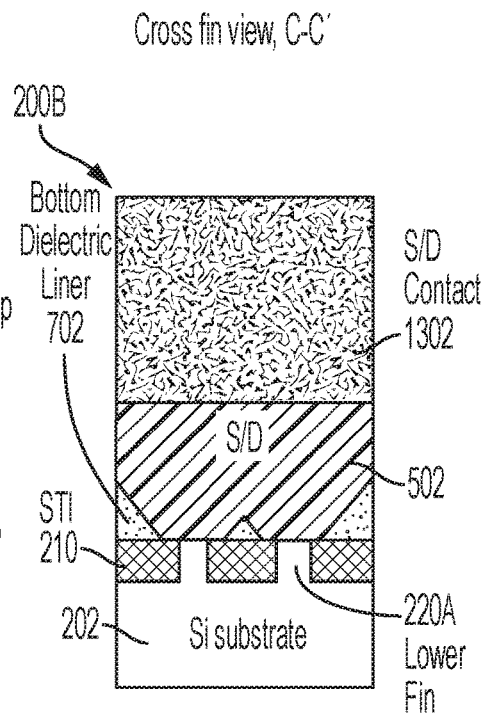
FIG. 17C depicts a cross-sectional view of the semiconductor structure shown in FIG. 17A taken along line C-C'.
Figure 17D:
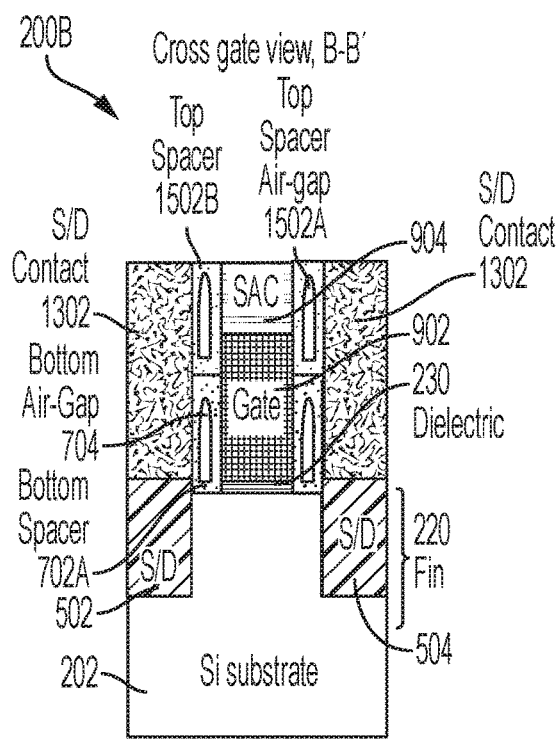
FIG. 17D depicts a cross-sectional view of the semiconductor structure shown in FIG. 17A taken along line B-B'.
Figure 17E:
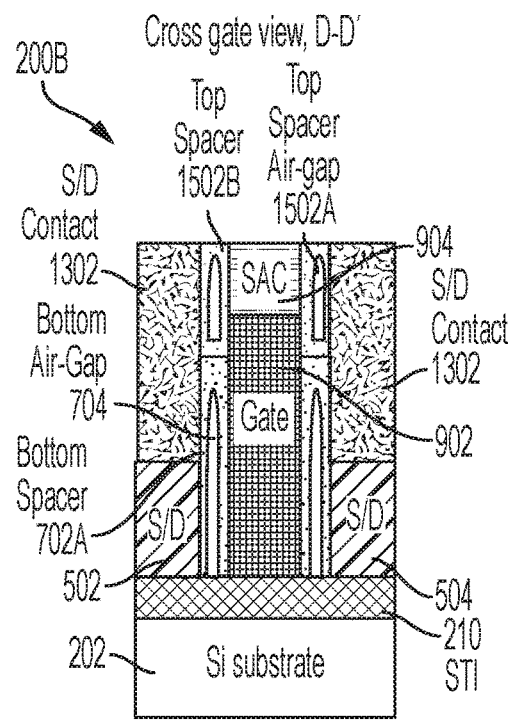
FIG. 17E depicts a cross-sectional view of the semiconductor structure shown in FIG. 17A taken along line D-D'.

FIG. 17A depicts a top-down view of a semiconductor structure 200B after fabrication operations in accordance with embodiments of the invention. FIG. 17B depicts a cross-sectional view of the semiconductor structure 200B shown in FIG. 17A taken along line A-A', FIG. 17C depicts a cross-sectional view of the semiconductor structure 200B shown in FIG. 17A taken along line C-C', FIG. 17D depicts a cross-sectional view of the semiconductor structure 200B shown in FIG. 17A taken along line B-B', and FIG. 17E depicts a cross-sectional view of the semiconductor structure 200B shown in FIG. 17A taken along line D-D'. The semiconductor structure 200B is formed using substantially the same fabrication operations used to form the semiconductor structure 200 (shown in FIGS. 2A-15E) with the following differences. As best shown in FIGS. 17D and 17E, the portions of the bottom dielectric layer 702 that is along sidewalls of the SAC region 904 has been removed to allow more lateral room for the top spacer 1502B. Because of the additional lateral room, and encapsulated air gap 1504A of the top spacer 1502B can be made larger than the top spacer air-gap 1504 (shown in FIGS. 15D and 15E) of the semiconductor structure 200.

Figure 18A:
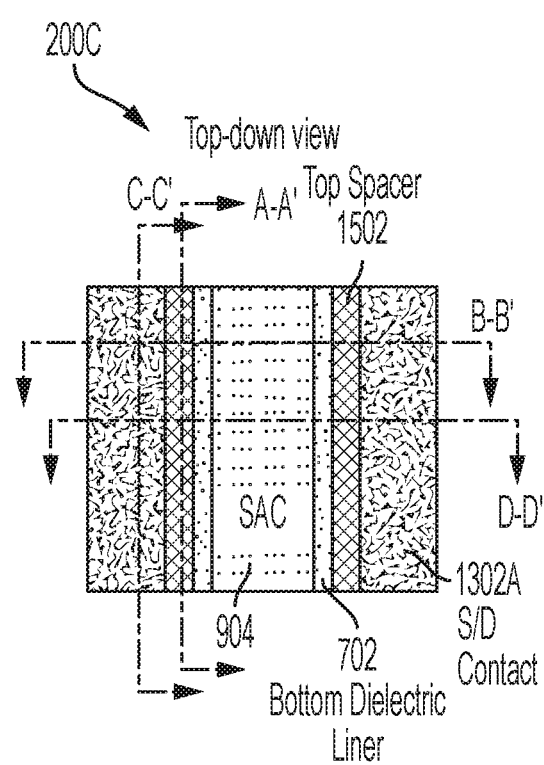
FIG. 18A depicts a top-down view of the semiconductor structure after fabrication operations in accordance with embodiments of the invention.
Figure 18B:
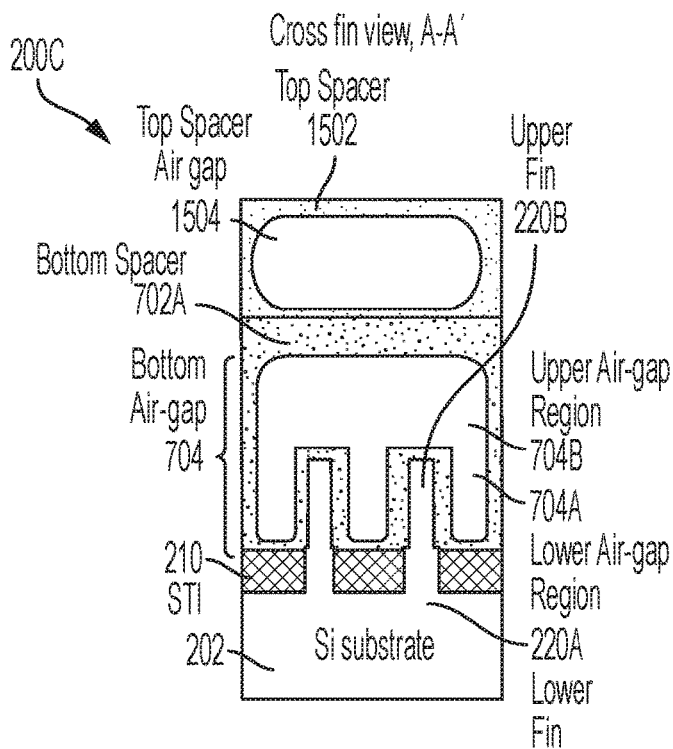
FIG. 18B depicts a cross-sectional view of the semiconductor structure shown in FIG. 18A taken along line A-A'.
Figure 18C:
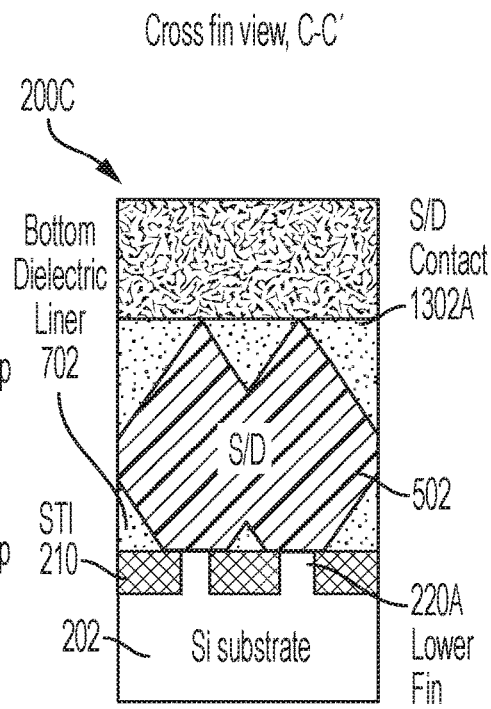
FIG. 18C depicts a cross-sectional view of the semiconductor structure shown in FIG. 18A taken along line C-C'.
Figure 18D:
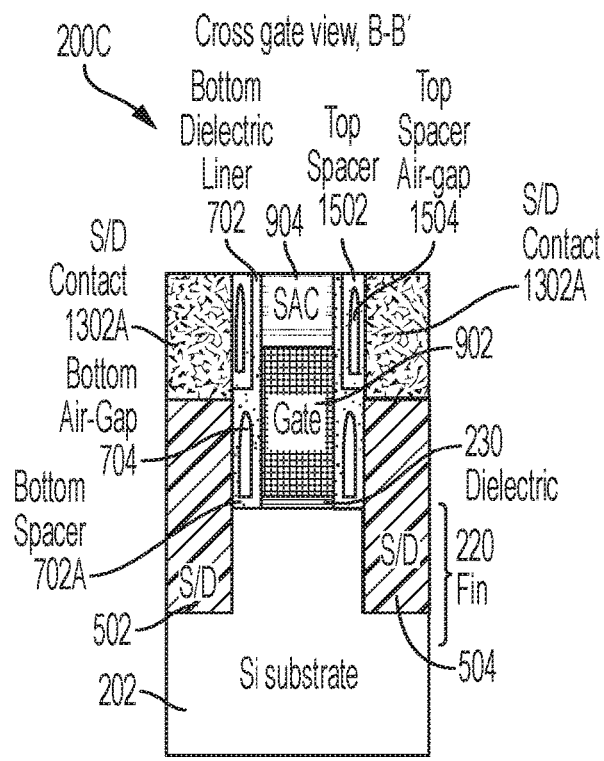
FIG. 18D depicts a cross-sectional view of the semiconductor structure shown in FIG. 18A taken along line B-B'.
Figure 18E:
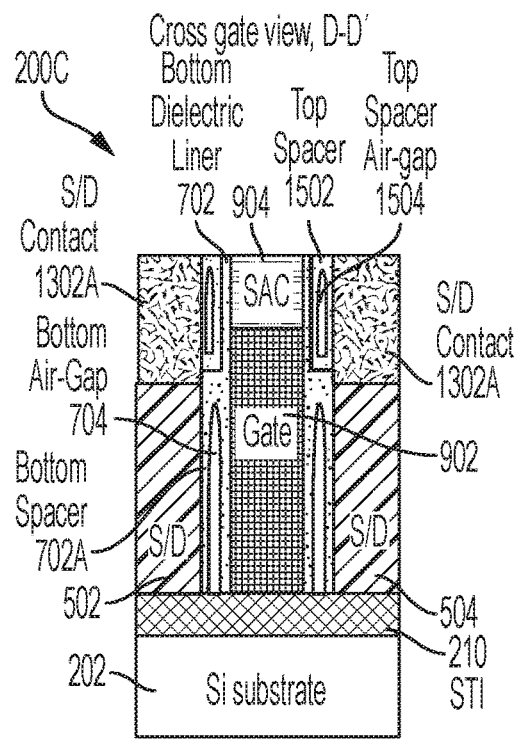
FIG. 18E depicts a cross-sectional view of the semiconductor structure shown in FIG. 18A taken along line D-D'.

FIG. 18A depicts a top-down view of the semiconductor structure 200C after fabrication operations in accordance with embodiments of the invention. FIG. 18B depicts a cross-sectional view of the semiconductor structure 200C shown in FIG. 18A taken along line A-A', FIG. 18C depicts a cross-sectional view of the semiconductor structure 200C shown in FIG. 18A taken along line C-C', FIG. 18D depicts a cross-sectional view of the semiconductor structure 200C shown in FIG. 18A taken along line B-B', and FIG. 18E depicts a cross-sectional view of the semiconductor structure 200C shown in FIG. 18A taken along line D-D'. The semiconductor structure 200C is formed using substantially the same fabrication operations used to form the semiconductor structure 200 (shown in FIGS. 2A-15E) with the following differences. As best shown in FIGS. 18D and 18E, the S/D regions 502, 504 are not recessed, thereby providing the S/D regions 502, 504 as raised S/D regions and forming S/D contacts 1302A having reduced height in comparison to the S/D contacts 1302 (shown in FIGS. 13A to 15E. In the embodiments of the invention depicted in FIGS. 18A to 18E, substantially all of the bottom air-gaps are positioned between the raised S/D regions 502, 504 and the gate 902, and substantially all of the top spacer air-gaps 1504 are positioned between the S/D contacts 1302A and portions of the gate 902.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    performing fabrication operations to form a field effect transistor (FET) device, wherein the fabrication operations include:
        forming a channel region over a substrate;
        forming a gate region over a top surface and along sidewalls of the channel region;
        forming a source or drain (S/D) region over the substrate;
        forming a bottom encapsulated air-gap over the substrate;
        positioning a first portion of the bottom encapsulated air-gap between the gate region and the S/D region;
        further positioning the first portion of the bottom encapsulated air-gap below the top surface of the channel region;
        forming a S/D contact over the S/D region; and
        positioning the S/D contact such that at least a second portion of the bottom encapsulating air-gap is between the gate region and the S/D contact.

2. The method of claim 1 further comprising forming the S/D contact subsequent to forming the bottom encapsulated air-gap.

3. The method of claim 1 further comprising forming a top encapsulated air-gap over the substrate.

4. The method of claim 3 further comprising positioning the top encapsulated air-gap over the bottom encapsulated air-gap.

5. The method of claim 4 further comprising positioning at least a first portion of the top encapsulated air-gap between the gate region and the S/D contact.

6. The method of claim 5 further comprising forming a cap region over the gate region.

7. The method of claim 6 further comprising positioning at least a second portion of the top encapsulated air-gap between the cap region and the S/D contact.

8. The method of claim 3 further comprising positioning a second portion of the top encapsulated air-gap below the top surface of the channel region.

9. The method of claim 1, wherein:
    the channel region comprises a central region of a fin; and
    the S/D region is formed on a first end region of the fin.

10. A field effect transistor (FET) device comprising:
    a channel region formed over a substrate;
    a gate region formed over a top surface and along sidewalls of the channel region;
    a source or drain (S/D) region formed over the substrate;
    a S/D contact formed over the S/D region; and
    a bottom encapsulated air-gap formed over the substrate;
    wherein a first portion of the bottom encapsulated air-gap is positioned between the gate region and the S/D region;
    wherein the first portion of the bottom encapsulated air-gap is further positioned below the top surface of the channel region; and
    wherein the S/D contact is positioned such that at least a second portion of the bottom encapsulated air-gap is between the gate region and the S/D contact.

11. The device of claim 10 further comprising a top encapsulated air-gap formed over the substrate.

12. The device of claim 11, wherein the top encapsulated air-gap is positioned over the bottom encapsulated air-gap.

13. The device of claim 12, wherein at least a first portion of the top encapsulated air-gap is positioned between the gate region and the S/D contact.

14. The device of claim 13 further comprising a cap region formed over the gate region, wherein at least a second portion of the top encapsulated air-gap is positioned between the cap region and the S/D contact.

15. The device of claim 11 further comprising a second portion of the top encapsulated air-gap positioned below the top surface of the channel region.

16. The device of claim 10, wherein:
    the channel region comprises a central region of a fin; and
    the S/D region is formed on a first end region of the fin.

* * * * *